(12) United States Patent
Kurokawa

(10) Patent No.: US 9,305,630 B2
(45) Date of Patent: Apr. 5, 2016

(54) SEMICONDUCTOR DEVICE AND METHOD FOR DRIVING THE SAME

(71) Applicant: SEMICONDUCTOR ENERGY LABORATORY CO., LTD., Atsugi-shi, Kanagawa-ken (JP)

(72) Inventor: Yoshiyuki Kurokawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/331,732

(22) Filed: Jul. 15, 2014

(65) Prior Publication Data

US 2015/0023114 A1  Jan. 22, 2015

(30) Foreign Application Priority Data

Jul. 17, 2013  (JP) .................................. 2013-148280

(51) Int. Cl.
  *G11C 7/22* (2006.01)
  *G11C 11/405* (2006.01)
  *H01L 27/115* (2006.01)
  *H01L 27/108* (2006.01)
  (Continued)

(52) U.S. Cl.
  CPC .......... *G11C 11/405* (2013.01); *H01L 27/1156* (2013.01); *G11C 11/4087* (2013.01); *G11C 11/4091* (2013.01); *H01L 27/108* (2013.01)

(58) Field of Classification Search
  CPC ............. G11C 16/0433; G11C 11/404; G11C 11/405; G11C 11/22; G11C 16/02; G11C 16/0483; G11C 7/12; G11C 11/24; G11C 11/4099; G11C 16/0408; G11C 16/10; G11C 16/26; G11C 11/406; G11C 11/4091
  See application file for complete search history.

(56) References Cited

U.S. PATENT DOCUMENTS

| 4,466,081 A | 8/1984 | Masuoka |
| 5,349,366 A | 9/1994 | Yamazaki et al. |
| 5,366,922 A | 11/1994 | Aoki et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Thong Q Le
(74) *Attorney, Agent, or Firm* — Fish & Richardson P.C.

(57) ABSTRACT

One of a source and a drain of a first oxide semiconductor (OS) transistor is connected to a gate of a second OS transistor and one electrode of a first capacitor. One of a source and a drain of the second OS transistor is connected to one electrode of a second capacitor and one of a source and a drain of a Si transistor. The gate of the second OS transistor serves as a charge retention node. Charge injection and retention at this node is controlled by the first OS transistor. The other of the source and the drain of the second OS transistor is connected to a wiring applying a high potential, and a potential of the second capacitor that corresponds to the write data is maintained. A signal corresponding to the write data is read by the Si transistor.

18 Claims, 15 Drawing Sheets

(51) Int. Cl.
*G11C 11/408* (2006.01)
*G11C 11/4091* (2006.01)

(56) References Cited

U.S. PATENT DOCUMENTS

| | | | |
|---|---|---|---|
| 5,731,856 A | 3/1998 | Kim et al. |
| 5,744,864 A | 4/1998 | Cillessen et al. |
| 5,796,650 A | 8/1998 | Wik et al. |
| 5,815,436 A | 9/1998 | Tanaka et al. |
| 5,851,866 A | 12/1998 | Son |
| 5,936,881 A | 8/1999 | Kawashima et al. |
| 5,943,270 A | 8/1999 | Borkar |
| 6,266,269 B1 | 7/2001 | Karp et al. |
| 6,294,274 B1 | 9/2001 | Kawazoe et al. |
| 6,353,553 B1 | 3/2002 | Tamada et al. |
| 6,563,174 B2 | 5/2003 | Kawasaki et al. |
| 6,570,206 B1 | 5/2003 | Sakata et al. |
| 6,628,551 B2 | 9/2003 | Jain |
| 6,727,522 B1 | 4/2004 | Kawasaki et al. |
| 6,765,825 B1 | 7/2004 | Scott |
| 6,787,835 B2 | 9/2004 | Atwood et al. |
| 6,808,971 B2 | 10/2004 | Bhattacharyya |
| 6,873,009 B2 | 3/2005 | Hisamoto et al. |
| 6,949,782 B2 | 9/2005 | Atwood et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,230,601 B2 | 6/2007 | Yamazaki et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,459,743 B2 | 12/2008 | Mandelman et al. |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,573,083 B2 | 8/2009 | Kijima et al. |
| 7,601,984 B2 | 10/2009 | Sano et al. |
| 7,623,372 B2 | 11/2009 | Kouno |
| 7,674,650 B2 | 3/2010 | Akimoto et al. |
| 7,687,331 B2 | 3/2010 | Kim et al. |
| 7,732,819 B2 | 6/2010 | Akimoto et al. |
| 7,741,644 B2 | 6/2010 | Lyu et al. |
| 7,790,530 B2 | 9/2010 | Mandelman et al. |
| 7,791,074 B2 | 9/2010 | Iwasaki |
| 7,935,582 B2 | 5/2011 | Iwasaki |
| 7,956,361 B2 | 6/2011 | Iwasaki |
| 8,154,024 B2 | 4/2012 | Iwasaki |
| 8,314,420 B2 | 11/2012 | Hoffman et al. |
| 8,319,218 B2 | 11/2012 | Yamazaki et al. |
| 8,324,628 B2 | 12/2012 | Kim et al. |
| 8,363,452 B2 | 1/2013 | Yamazaki et al. |
| 8,384,077 B2 | 2/2013 | Yano et al. |
| 8,508,967 B2 | 8/2013 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0158829 A1 | 10/2002 | Yamazaki et al. |
| 2003/0016555 A1 | 1/2003 | Kubota et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0073871 A1 | 4/2005 | Luk et al. |
| 2005/0185474 A1 | 8/2005 | Atwood et al. |
| 2005/0199959 A1 | 9/2005 | Chiang et al. |
| 2005/0237786 A1 | 10/2005 | Atwood et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0047293 A1 | 3/2007 | Mandelman et al. |
| 2007/0052025 A1 | 3/2007 | Yabuta |
| 2007/0054507 A1 | 3/2007 | Kaji et al. |
| 2007/0081380 A1 | 4/2007 | Atwood et al. |
| 2007/0090365 A1 | 4/2007 | Hayashi et al. |
| 2007/0108446 A1 | 5/2007 | Akimoto |
| 2007/0126042 A1 | 6/2007 | Kijima et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0315193 A1 | 12/2008 | Kim et al. |
| 2009/0002590 A1 | 1/2009 | Kimura |
| 2009/0008638 A1 | 1/2009 | Kang et al. |
| 2009/0020753 A1 | 1/2009 | Jeong et al. |
| 2009/0045397 A1 | 2/2009 | Iwasaki |
| 2009/0047756 A1 | 2/2009 | Mandelman et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0155940 A1 | 6/2009 | Lee et al. |
| 2009/0189153 A1 | 7/2009 | Iwasaki et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0140614 A1 | 6/2010 | Uchiyama et al. |
| 2010/0193785 A1 | 8/2010 | Kimura |
| 2010/0276685 A1 | 11/2010 | Itagaki et al. |
| 2010/0276689 A1 | 11/2010 | Iwasaki |

(56) References Cited

U.S. PATENT DOCUMENTS

| | | | |
|---|---|---|---|
| 2010/0279462 | A1 | 11/2010 | Iwasaki |
| 2011/0089417 | A1 | 4/2011 | Yamazaki et al. |
| 2011/0101334 | A1 | 5/2011 | Yamazaki et al. |
| 2011/0101339 | A1 | 5/2011 | Yamazaki et al. |
| 2011/0101352 | A1 | 5/2011 | Hosono et al. |
| 2011/0122670 | A1 | 5/2011 | Yamazaki et al. |
| 2011/0201162 | A1 | 8/2011 | Hosono et al. |
| 2011/0260158 | A1* | 10/2011 | Takemura ............ 257/43 |
| 2012/0012838 | A1 | 1/2012 | Hosono et al. |
| 2012/0037972 | A1 | 2/2012 | Yoneda |
| 2013/0062601 | A1 | 3/2013 | Yamazaki et al. |
| 2013/0140558 | A1 | 6/2013 | Yamazaki et al. |
| 2013/0292671 | A1 | 11/2013 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-119675 A | 6/2011 |
| JP | 2012-256820 A | 12/2012 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09 : Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

(56) References Cited

OTHER PUBLICATIONS

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2007, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, andYb2Fe3O7 Types of Structures for Compounds in the In2O3 and SC2O3—A2O3—Bo Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vaccum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Ishimaru.K, 45 nm/32 nm CMOS—Challenge and perspective,, Solid-State Electronics, Sep. 1, 2008, vol. 52, No. 9, pp. 1266-1273.

* cited by examiner

SEMICONDUCTOR DEVICE AND METHOD FOR DRIVING THE SAME

BACKGROUND OF THE INVENTION

1. Field of the Invention

The present invention relates to a semiconductor device and a driving method thereof.

2. Description of the Related Art

Much attention has been focused on a semiconductor device that retains data by using a combination of a transistor in which silicon (Si) is used for a semiconductor layer including a channel formation region (Si transistor) and a transistor in which an oxide semiconductor (OS) is used for a semiconductor layer including a channel formation region (OS transistor) (see Patent Document 1). Moreover, a semiconductor device that retains data with a combination of an OS transistor and a capacitor has attracted attention (see Patent Document 2).

REFERENCE

Patent Document 1: Japanese Published Patent Application No. 2011-119675
Patent Document 2: Japanese Published Patent Application No. 2012-256820

SUMMARY OF THE INVENTION

Downsizing of Si transistors is effective in improving the performance of a semiconductor device. However, downsizing of Si transistors results in thinner gate insulating films, thereby posing a problem of leakage current through a gate insulating film. For this reason, when a node for holding charge is connected to a gate of a Si transistor as in the semiconductor device in Patent Document 1, charge accumulated at the node leaks through a gate insulating film of the Si transistor. Thus, in a semiconductor device that retains data by using the feature of the OS transistor of low off-state leakage current (off-state current), charge retention characteristics of the node deteriorate.

In a semiconductor device that retains data with a combination of an OS transistor and a capacitor, the speed of reading data from a memory cell depends on the driving capability of the OS transistor because data is directly read through the OS transistor. For this reason, the semiconductor device does not benefit from the improvement in the driving capability due to downsizing of Si transistors.

In view of the above, an object of one embodiment of the present invention is to provide a novel-structured semiconductor device with excellent charge retention characteristics of a node for holding charge. Another object of one embodiment of the present invention is to provide a novel-structured semiconductor device with fast data reading from a memory cell.

Note that the descriptions of these objects do not disturb the existence of other objects. In one embodiment of the present invention, there is no need to achieve all the objects. Objects other than the above objects will be apparent from and can be derived from the description of the specification, the drawings, the claims, and the like.

A memory cell of one embodiment of the present invention is composed of a first OS transistor (also referred to as first transistor), a second OS transistor (also referred to as second transistor), a Si transistor (also referred to as third transistor), a first capacitor, and a second capacitor. One of a source and a drain of the first OS transistor is connected to a gate of the second OS transistor and one electrode of the first capacitor. One of a source and a drain of the second OS transistor is connected to one electrode of the second capacitor and one of a source and a drain of the Si transistor. The gate of the second OS transistor serves as a node for retaining charge (charge retention node). Charge injection into the charge retention node and charge retention at this node are controlled by the first OS transistor, and a potential corresponding to write data is stored at the charge retention node. The other of the source and the drain of the second OS transistor is connected to a wiring for applying a high potential, and a potential of the second capacitor that corresponds to the write data is maintained. Then, a signal corresponding to the write data is read by the Si transistor.

Although the Si transistor and the second capacitor in the above structure are similar to components in a DRAM cell, refresh operation is not necessary because charge is injected through the second OS transistor even if the potential of the second capacitor is changed during data retention or data reading. Furthermore, downsizing of the Si transistor results in higher read speed. A semiconductor device with excellent charge retention characteristics is obtained when the first OS transistor is a transistor with ultra-low off-state current and the second OS transistor is a transistor with ultra-low gate leakage current, specifically, a transistor including a sufficiently thick gate insulating film.

One embodiment of the present invention is a semiconductor device including first to third transistors and first and second capacitors. One of a source and a drain of the first transistor is electrically connected to a write data line. A gate of the first transistor is electrically connected to a write selection line. One of a source and a drain of the second transistor is electrically connected to a wiring applying a constant potential. A gate of the second transistor is electrically connected to the other of the source and the drain of the first transistor. One electrode of the first capacitor is electrically connected to the other of the source and the drain of the first transistor and the gate of the second transistor. The other electrode of the first capacitor is electrically connected to a ground line. One electrode of the second capacitor is electrically connected to the other of the source and the drain of the second transistor. The other electrode of the second capacitor is electrically connected to the ground line. A gate of the third transistor is electrically connected to a read selection line. One of a source and a drain of the third transistor is electrically connected to the other of the source and the drain of the second transistor. The other of the source and the drain of the third transistor is electrically connected to a read data line. The first transistor includes a semiconductor layer containing an oxide semiconductor. The third transistor includes a semiconductor layer containing single crystal silicon. The thickness of a gate insulating film of the second transistor is larger than that of a gate insulating film of the third transistor.

In the semiconductor device of one embodiment of the present invention, the first capacitor and the second capacitor are preferably provided in one layer.

In the semiconductor device of one embodiment of the present invention, the second transistor preferably includes a semiconductor layer that contains silicon and is provided in a layer different from the semiconductor layer of the third transistor.

In the semiconductor device of one embodiment of the present invention, the second transistor preferably includes a semiconductor layer containing an oxide semiconductor.

In the semiconductor device of one embodiment of the present invention, the first transistor and the second transistor are preferably provided in one layer.

One embodiment of the present invention is a method for driving a semiconductor device including the following steps. In a first step, a first transistor is turned on, data at one of a source and a drain of the first transistor is written into a first node connected to the other of the source and the drain of the first transistor, and then the first transistor is turned off so that the data is stored at the first node. In a second step, the conduction state of a second transistor whose gate is electrically connected to the first node is controlled in accordance with the data, and whether a potential of a wiring connected to one of a source and a drain of the second transistor is applied to a second node connected to the other of the source and the drain of the second transistor or not is controlled so that a read potential corresponding to the data is held at the second node. In a third step, a third transistor electrically connected to the second node is turned on to electrically connect the second node and a read data line in an electrically floating state, and a changed potential of the read data line is read. In a fourth step, the third transistor is turned off, and the conduction state of the second transistor is controlled in accordance with the data to restore the read potential changed by electrically connecting the second node and the read data line.

In the method for driving a semiconductor device in one embodiment of the present invention, the read potential held at the second node is preferably a potential that is applied through the second transistor and applied through the third transistor in an on state at the same time.

In the method for driving a semiconductor device in one embodiment of the present invention, the read data line is brought into an electrically floating state by setting a potential of the read data line at L level.

One embodiment of the present invention can provide a novel-structured semiconductor device with excellent charge retention characteristics of a node for holding charge. Furthermore, one embodiment of the present invention can provide a novel-structured semiconductor device with fast data reading from a memory cell.

BRIEF DESCRIPTION OF THE DRAWINGS

In the accompanying drawings.

DETAILED DESCRIPTION OF THE INVENTION

Figure 1:
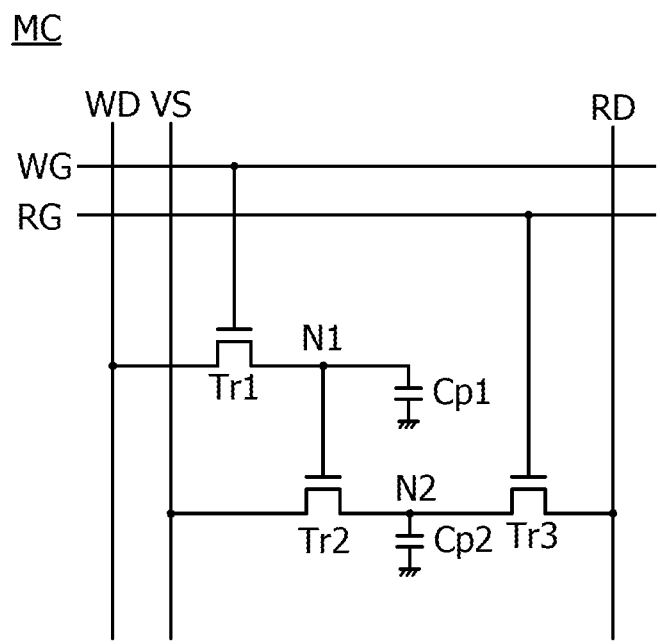
FIG. 1 is a circuit diagram of one embodiment of the present invention.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments. Note that in structures of the present invention described below, reference numerals denoting the same portions are used in common in different drawings.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, variation in signal, voltage, or current due to noise or difference in timing can be included.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source.

Here, since the source and the drain of the transistor may change depending on the structure, operating conditions, and the like of the transistor, it is difficult to define which is a source or a drain. Thus, it is possible that a portion functioning as the source and a portion functioning as the drain are not called a source and a drain, and that one of the source and the drain is referred to as a first electrode and the other is referred to as a second electrode.

In this specification and the like, ordinal numbers such as first, second, and third are used to avoid confusion among components, and thus do not limit the number of the components.

In this specification and the like, the expression "A and B are connected" means the case where A and B are electrically connected to each other in addition to the case where A and B are directly connected to each other. Here, the expression "A and B are electrically connected" means the case where electric signals can be transmitted and received between A and B when an object having any electric action exists between A and B.

In this specification and the like, terms for explaining arrangement, such as "over" and "under", are used for convenience to describe the positional relation between components with reference to drawings. Furthermore, the positional relation between components is changed as appropriate in accordance with a direction in which each component is described. Thus, there is no limitation on terms used in this specification, and description can be made as appropriate depending on the situation.

In this specification and the like, the layout of circuit blocks in a drawing specifies the positional relation for description. Thus, even when a drawing shows that different functions are achieved in different circuit blocks, an actual circuit block may be configured so that the different functions are achieved in the same circuit or region. In addition, the function of each circuit block in a drawing is specified for description. Thus, even when one circuit block is illustrated, an actual circuit or region may be configured so that processing which is shown as being performed in the one circuit block is performed in a plurality of circuit blocks.

In this specification and the like, voltage often refers to a difference between a given potential and a reference potential (e.g., a ground potential). Accordingly, voltage, potential, and potential difference can also be referred to as potential, voltage, and voltage difference, respectively. Note that voltage refers to a difference between potentials of two points, and potential refers to electrostatic energy (electric potential energy) of a unit charge at a given point in an electrostatic field.

In this specification and the like, the term "parallel" indicates that the angle formed between two straight lines ranges from −10° to 10°, and accordingly also includes the case where the angle ranges from −5° to 5°. The term "perpendicular" indicates that the angle formed between two straight lines ranges from 80° to 100°, and accordingly also includes the case where the angle ranges from 85° to 95°.

In this specification and the like, the trigonal and rhombohedral crystal systems are included in the hexagonal crystal system.

Embodiment 1

In this embodiment, a circuit structure and operation of a semiconductor device will be described.

Note that a semiconductor device refers to a device including a semiconductor element. The semiconductor device includes a driver circuit for driving a circuit including a semiconductor element, for example. Note that the semiconductor device may include a driver circuit, a power supply circuit, or the like provided over another substrate, in addition to a memory cell.

FIG. 1 is a circuit diagram illustrating an example of a memory cell MC included in a semiconductor device. In an actual semiconductor device, memory cells MC are arranged in a matrix.

First, components included in the memory cell MC will be described.

The memory cell MC illustrated in FIG. 1 includes a transistor Tr1, a transistor Tr2, a transistor Tr3, a capacitor Cp1, and a capacitor Cp2. Note that the transistors Tr1 to Tr3 are n-channel transistors in FIG. 1. In FIG. 1, a circuit portion constituted by the transistor Tr1, the transistor Tr2, and the capacitor Cp1 includes a node for retaining charge (charge retention node).

The transistor Tr1 has a function of controlling writing of data into the charge retention node in accordance with a write selection signal. A gate of the transistor Tr1 is connected to a write selection line WG for applying a write selection signal. One of a source and a drain of the transistor Tr1 is connected to a write data line WD for applying data.

The transistor Tr2 has a function of controlling charge and discharge of a node used for data reading (data reading node) in accordance with a potential corresponding to data written into the charge retention node. A gate of the transistor Tr2 is connected to the other of the source and the drain of the transistor Tr1 and one electrode of the capacitor Cp1. One of a source and a drain of the transistor Tr2 is connected to a wiring VS for applying a constant potential. Note that the charge retention node, where the other of the source and the drain of the transistor Tr1, the gate of the transistor Tr2, and the one electrode of the capacitor Cp1 are connected, is hereinafter referred to as a node N1.

The transistor Tr3 has a function of controlling reading of a potential corresponding to data (a read potential) from the data reading node in accordance with a read selection signal when the transistor Tr2 is on. A gate of the transistor Tr3 is connected to a read selection line RG for applying a read selection signal. One of a source and a drain of the transistor Tr3 is connected to the other of the source and the drain of the transistor Tr2 and one electrode of the capacitor Cp2. The other of the source and the drain of the transistor Tr3 is connected to a read data line RD supplied with a voltage for reading data. Note that the data reading node, where the other of the source and the drain of the transistor Tr2, the one of the source and the drain of the transistor Tr3, and the one electrode of the capacitor Cp2 are connected, is hereinafter referred to as a node N2.

The capacitor Cp1 has a function of holding a potential of the node N1. The one electrode of the capacitor Cp1 is connected to the node N1. The other electrode of the capacitor Cp1 is connected to a ground line. Note that the other electrode of the capacitor Cp1 only needs to be connected to a wiring at a constant potential and is not necessarily connected to a ground line.

The capacitance of the capacitor Cp1 needs to be large enough to prevent a potential change accompanied by charge transfer at the node N1. Thus, the use of the parasitic capacitance of the node N1 or the gate capacitance of the transistor Tr2 allows omission of the capacitor Cp1 in some cases.

The capacitor Cp2 has a function of holding a potential of the node N2. The one electrode of the capacitor Cp2 is connected to the node N2. The other electrode of the capacitor Cp2 is connected to a ground line. Note that the other electrode of the capacitor Cp2 only needs to be connected to a wiring at a constant potential and is not necessarily connected to a ground line.

The capacitance of the capacitor Cp2 needs to be large enough to read data by a change in the potential of the read data line RD due to the capacitance of the node N2 when data is read through the read data line RD. Thus, the use of the parasitic capacitance of the node N2 allows omission of the capacitor Cp2 in some cases.

For description, the name of a signal line, such as the write selection line WG, the read selection line RG, the write data line WD, or the read data line RD, is a combination of some functions of the signal line. Functions of each signal line are not limited by its name. Note that the write selection line WG, the read selection line RG, the write data line WD, and the read data line RD can be simply referred to as a signal line in this specification.

A write selection signal applied to the write selection line WG is a signal for controlling the on/off state of the transistor Tr1. In the case where the transistor Tr1 is an n-channel transistor, the transistor Tr1 is turned on when the write selection signal is at H level and is turned off when the write selection signal is at L level. When the transistor Tr1 is turned on, the potential of one of the source and the drain of the transistor Tr1 (the potential of the write data line WD) is applied to the other of the source and the drain of the transistor Tr1 (the node N1). Note that a potential written into the node N1 is sometimes lower than the potential of the write data line WD by the threshold voltage of the transistor Tr1. For this reason, it is preferable that the H-level potential of the write selection signal be previously set higher than a potential applied to the write data line WD.

Data applied to the write data line WD is data to be stored at the node N1. For example, when 1-bit data is stored at the node N1, an L-level potential is stored as data "0" and an H-level potential is stored as data "1".

The node N1 is a node for holding a potential corresponding to data applied to the write data line WD. The node N1 can store data corresponding to the held potential because the potential change accompanied by charge transfer is made as small as possible. At the node N1, the potential change accompanied by charge transfer is made as small as possible by reducing leakage current through the transistor Tr1 and a gate insulating film of the transistor Tr2; thus, the node N1 can store data corresponding to the held potential.

The wiring VS for applying a constant potential is supplied with a potential for charging and discharging the node N2, in accordance with a change in the conduction state of the transistor Tr2. For example, the wiring VS is supplied with an H-level potential.

A read selection signal applied to the read selection line RG is a signal for controlling the on/off state of the transistor Tr3. Specifically, in the case where the transistor Tr3 is an n-channel transistor, the transistor Tr3 is turned on when the read selection signal is at H level, and is turned off when the read selection signal is at L level.

The node N2 is capable of maintaining a read potential. A read potential is supplied through the read data line RD when the transistor Tr3 is turned on. By turning on the transistor Tr3, an H-level or L-level potential corresponding to data applied to the read data line RD is supplied to the node N2, whereby data can be written.

The node N2 can store a read potential, which is a potential corresponding to data, by utilizing switching of the on/off state of the transistor Tr2 depending on the potential of the node N1 when the transistor Tr3 is off. For example, when the potential of the node N1 is at H level, the transistor Tr2 is turned on, and the H-level potential of the wiring VS for applying a constant potential is supplied to the node N2 as a read potential. On the other hand, when the potential of the node N1 is at L level, the transistor Tr2 is turned off, and an L-level potential applied from the read data line RD through the transistor Tr3 in advance is supplied to the node N2 as a read potential.

The read potential of the node N2 can be read through the read data line RD by turning on the transistor Tr3. Data can be read by using changes in the potentials of the read data line RD and the node N2 due to capacitive coupling between parasitic capacitance of the read data line RD and the capacitor Cp2 when the transistor Tr3 is turned on.

To read the read potential of the node N2 through the read data line RD, the read data line RD needs to be supplied with a potential in advance to be electrically floating. A specific example of a potential applied to the read data line RD is an L-level potential, a ground potential, or a precharge potential.

Note that the potential of the node N2 that is changed by data reading can be restored to the original potential in accordance with the potential of the node N1. Specifically, when an H-level potential of the node N2 is decreased by data reading, the transistor Tr2 is turned on because the potential of the node N1 is at H level, and the H-level potential of the wiring VS is applied to the node N2; thus, the potential of the node N2 can be restored to the original H-level potential. When the potential of the node N2 is at L level, it is preferable to take measures to prevent a change in the potential of the node N2 due to data reading. For example, at the time of data reading, an L-level potential is applied as a potential for making the read data line RD electrically floating.

Note that when a read potential is an H-level potential, the potential of the node N2 is decreased by leakage current of the capacitor Cp2, leakage current between the source and the drain of the transistor Tr3, or the like. However, when data stored in the memory cell is data "1", that is, when the potential of the node N1 is at H level, the transistor Tr2 is turned on; consequently, charge compensating for a decrease in the potential of the node N2 is supplied through the transistor Tr2, and the potential of the node N2 can be kept constant.

The above is the description of the components in the memory cell MC.

With the structure illustrated in FIG. 1, a potential corresponding to data is held at the node N1, so that the memory cell MC can store the data. Furthermore, a read potential of the node N2 can be held in accordance with the data. Data applied to the write data line WD is written into the node N1 by turning on the transistor Tr1. Moreover, by turning off the transistor Tr1, the potential can be held at the node N1 for a long time, whereby the memory cell MC can store data.

To prevent a potential change accompanied by charge transfer at the node N1 and retain data for a long time, the following two features are required: one is extremely low leakage current between the source and the drain of the transistor Tr1, and the other is extremely low leakage current through a gate insulating film of the transistor Tr2.

To prevent a potential change accompanied by charge transfer at the node N1, the transistor Tr1 is preferably a transistor with extremely low leakage current between its source and drain. Here, low leakage current means that a normalized leakage current per micrometer in channel width at room temperature is 10 zA/μm or lower. Since leakage current is preferably as low as possible, the normalized leakage current is preferably 1 zA/μm or lower, more preferably 10 yA/μm or lower, still more preferably 1 yA/μm or lower. Note that a voltage between the source and the drain in this case is, for example, approximately 0.1 V, 5 V, or 10 V. An example of a transistor with extremely low leakage current between its source and drain is a transistor in which a channel is formed in an oxide semiconductor.

To prevent a potential change accompanied by charge transfer at the node N1, the transistor Tr2 is preferably a transistor with extremely low leakage current through a gate insulating film. The leakage current through the gate insulating film of the transistor Tr2 is preferably as low as the leakage current between the source and the drain of the transistor Tr1.

The leakage current of the transistor Tr2 through the gate insulating film is preferably 10 yA or lower, more preferably 1 yA or lower to prevent a potential change accompanied by charge transfer at the node N1. To achieve such leakage current, the thickness of the gate insulating film of the transistor Tr2 is preferably larger than that of the gate insulating film of the transistor Tr3 that is a Si transistor.

A leakage current of the transistor Tr2 through the gate insulating film of 10 yA or lower is calculated on the basis of a retention period necessary to hold charge corresponding to data at the node N1. Specifically, when the capacitance C of the node N1 is 10 fF and allowable voltage change $\Delta V$ is 0.3 V, a leakage current I that allows charge Q to be held for about 10 years ($t \approx 3 \times 10^8$ s) is estimated at 10 yA or lower using Equation (1).

$$Q = C \times V \geq I \times t \qquad (1)$$

In terms of equivalent oxide thickness, the thickness of the gate insulating film that achieves a leakage current of 10 yA or lower, which enables the above-described charge retention, is estimated at approximately 6 nm or more in a transistor with a channel width and length of 1 μm and 1 μm.

Estimation of the thickness of the gate insulating film is explained using a graph of FIG. 9 in the following non-patent document: Kazunari Ishimaru, "45 nm/32 nm CMOS—Challenge and perspective", Solid-State Electronics, Vol. 52, 2008, pp. 1266-1273.

Figure 9:
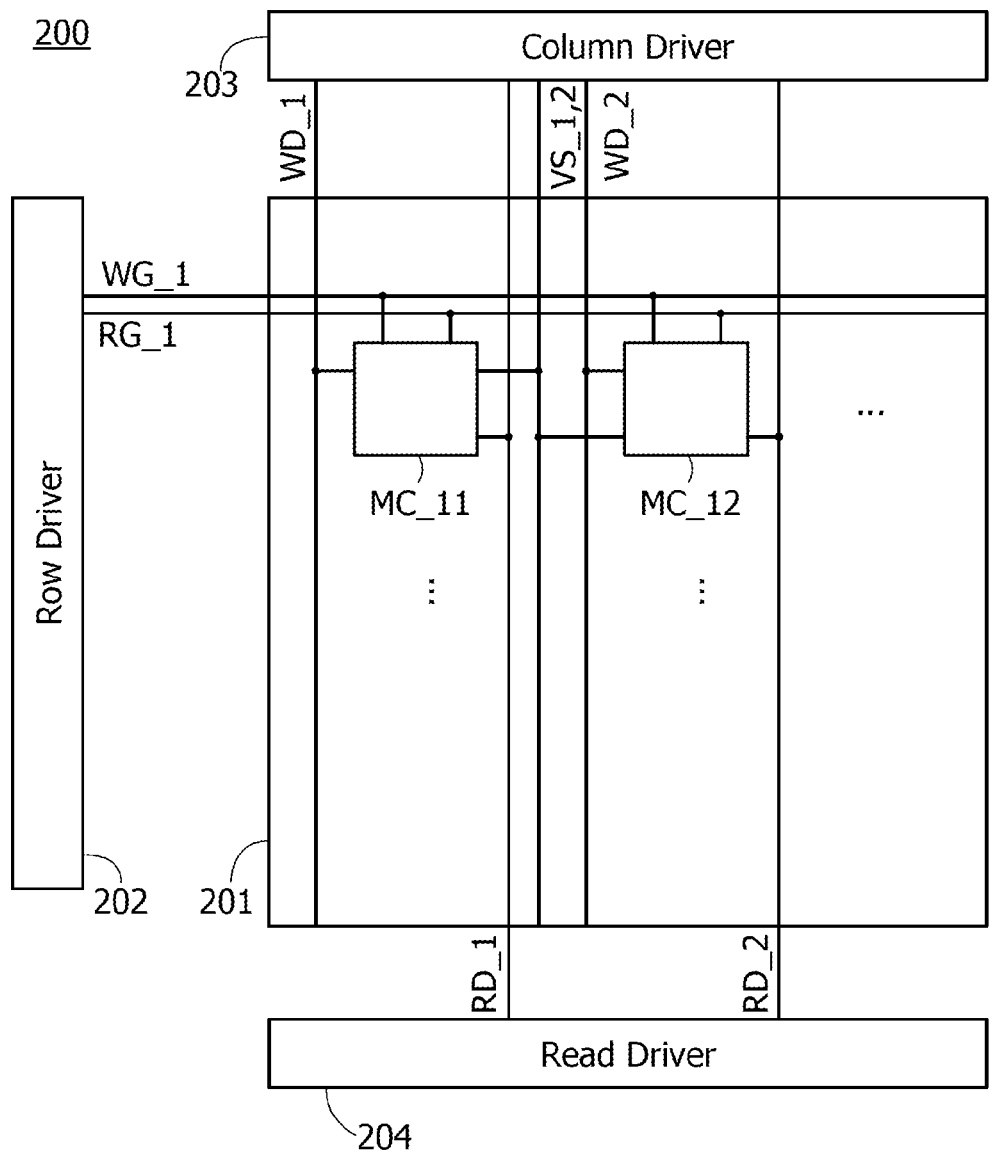
FIG. 9 is a block diagram of one embodiment of the present invention.

FIG. 9 in the non-patent document is a graph with equivalent oxide thickness (nm) of a gate insulating film as the horizontal axis and leakage current per unit area (A/cm$^2$) as the vertical axis. From the slope of the straight line representing the characteristics of silicon oxide in this graph, the amount of leakage current per unit area can be estimated to be approximately 1/10000 times as the thickness of silicon oxide is increased by 1 nm. According to FIG. 9 in the non-patent document, the leakage current with a 2-nm-thick silicon oxide film can be estimated at $1 \times 10^{-1}$ A/cm$^2$, that is, $1 \times 10^{-9}$ A/μm$^2$. Based on this value and the rate of change of the leakage current per unit area, which varies as the thickness of silicon oxide is increased in increments of 1 nm, the leakage current per unit area with a gate insulating film having an equivalent oxide thickness of about 6 nm can be estimated at approximately $1 \times 10^{-25}$ A/μm$^2$. From this leakage current per unit area, the thickness of the gate insulating film to achieve a leakage current of 10 yA or lower in a transistor with a channel width and length of 1 μm and 1 μm can be estimated at approximately 6 nm or more. Even when the transistor Tr3 is a Si transistor formed in a fine process, the thickness of the gate insulating film in the transistor Tr3 may be the same as that of the gate insulating film in the transistor Tr2 as long as it is 6 nm or more.

In the memory cell MC illustrated in FIG. 1, the on/off state of the transistor Tr2 is controlled in accordance with the potential of the node N1. The transistor Tr2 needs to have driving capability high enough to apply the potential of the wiring VS during its on state to the node N2 and charge and discharge the capacitor Cp2.

The transistor Tr3 needs to discharge the read data line RD at high speed when data read operation is performed, and thus requires higher driving capability than the transistor Tr2. For this reason, the transistor Tr3 is preferably a downsized Si transistor. Since the node N1 is not connected to the gate of the transistor Tr3 in the structure of this embodiment, charge retention at the node N1 is not directly affected even when the gate insulating film of the transistor Tr3 is thinned due to downsizing and the amount of leakage current flowing through the gate insulating film is increased.

As has been described, the driving capability of the transistor Tr2 may be relatively lower than that of the transistor Tr3. Accordingly, the transistor Tr2 can have a thicker gate insulating film than the transistor Tr3 and have extremely low leakage current, which is lower than or equal to the leakage current between the source and the drain of the transistor Tr1.

The node N1 in FIG. 1 is formed by using an OS transistor as the transistor Tr1 and a transistor with low leakage current through a gate insulating film as the transistor Tr2, whereby a semiconductor device that excels in charge retention characteristics of the node N1 is provided.

The transistor Tr2 is a transistor with extremely low leakage current through the gate insulating film. Moreover, the transistor Tr2 is preferably an OS transistor like the transistor Tr1, in which case the amount of current flowing through the transistor Tr2 in the off state can be reduced. Thus, unintended leakage current can be prevented from flowing between the wiring VS and the read data line RD.

With the structure of this embodiment, the memory cell MC can serve as a nonvolatile memory circuit, which stores data even after power supply is stopped. Thus, data written into the node N1 can be continuously stored at the node N1 until the transistor Tr1 is turned on again. In the structure of this embodiment, charge retention at the node N1 is not adversely affected even if the amount of leakage current flowing through the gate insulating film of the transistor Tr3 is increased. Consequently, it is possible to provide a semiconductor device in which the function of a nonvolatile memory circuit is not impaired even if leakage current through the gate insulating film of the Si transistor occurs.

The memory cell MC having the structure in FIG. 1 has advantages of achieving a semiconductor device with high read speed as well as a semiconductor device with excellent charge retention characteristics. Although data is read from the memory cell MC in a manner similar to that of a DRAM cell consisting of the transistor Tr3 and the capacitor Cp2, the structure in this embodiment is useful in the following aspects.

In a general DRAM cell, the potential of the capacitor is changed after data reading, so that data needs to be rewritten and in a period for data rewriting, data cannot be written into or read from another memory cell. In contrast, in the structure of this embodiment, charge is supplied through the transistor Tr2 after the transistor Tr3 is turned off. Thus, without refresh operation after data reading, data can be written into or read from another memory cell.

In addition, to read data from a general DRAM cell, change in the potential of a bit line due to capacitance distribution between the capacitance of the capacitor in the memory cell and the parasitic capacitance of the bit line needs to be large enough to be detected by a sense amplifier or the like; therefore, the capacitance of the capacitor in the memory cell needs to be large. In contrast, in the structure of this embodiment, the transistor Tr2 also influences a change in the potential of the read data line RD, so that the capacitance of the capacitor Cp2 in the memory cell MC can be low.

Figure 2A:
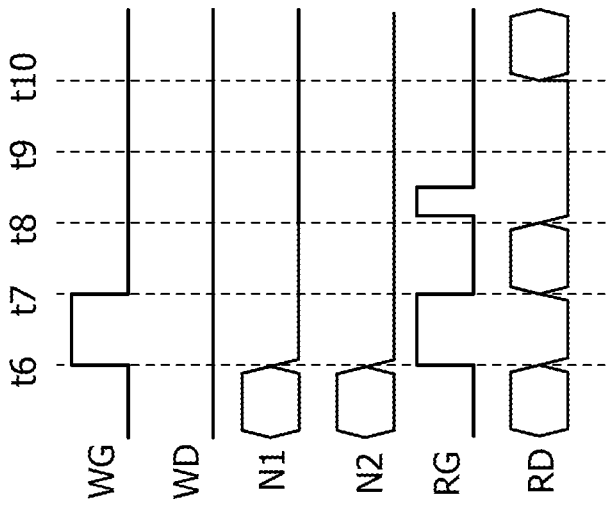
FIGS. 2A and 2B are timing charts of one embodiment of the present invention.
Figure 2B:
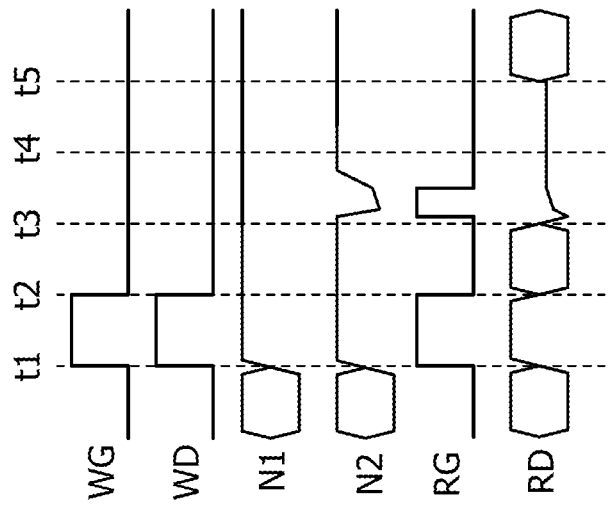

Next, an example of the operation of the memory cell MC illustrated in FIG. 1 will be described using timing charts in FIGS. 2A and 2B. The timing charts in FIGS. 2A and 2B show changes in the potentials of the write selection line WG, the write data line WD, the node N1, the node N2, the read selection line RG, and the read data line RD from the time t1 to the time t10.

First, the timing chart in FIG. 2A will be described. FIG. 2A illustrates the case where data "1" (here, an H-level potential) is written into the memory cell MC.

From the time t1 to the time t2, the write selection line WG, the write data line WD, the read selection line RG, and the read data line RD are set at H level. Thus, the potential of the node N1 in the memory cell MC becomes H level. Here, in the memory cell MC, the transistor Tr2 and the transistor Tr3 are turned on, so that the potential of the node N2 becomes H level and an H-level potential is held at the capacitor Cp2.

From the time t2 to the time t3, the write selection line WG, the write data line WD, and the read selection line RG are set at L level. Note that the potential of the read data line RD is a given potential, and an H-level or L-level potential is applied to the read data line RD by data writing in another row, for example.

From the time t3 to the time t4, data in the memory cell MC is read. Here, the read selection line RG is set at H level. Note that at the time t3, the potential of the read data line RD is preferably pulled down, that is, the potential of the read data line RD is preferably a ground potential corresponding to an L-level potential.

From the time t3 to the time t4, in the memory cell MC, capacitive coupling occurs between the capacitance of the capacitor Cp2 at H level and the parasitic capacitance of the read data line RD at L level through the transistor Tr3; thus, the potentials of the capacitor Cp2 and the read data line RD become higher than the L-level potential. Consequently, data can be read by detecting a change in the potential of the read data line RD.

Note that from the time t3 to the time t4, in the memory cell MC, while the read selection line RG is at H level, the H-level potential of the wiring VS is supplied to the capacitor Cp2 and the read data line RD through the transistor Tr2 and the transistor Tr3, and the potentials of the node N2 and the read data line RD increase. Accordingly, even when a change in the potential of the read data line RD due to capacitive coupling between the capacitance of the capacitor Cp2 and the parasitic capacitance of the read data line RD is small because the capacitance of the capacitor Cp2 is small, the amount of change in the potential of the read data line RD can be increased by making the time for reading data longer. In a general DRAM cell, the amount of change in the potential is increased only by making a potential change due to capacitive coupling larger, that is, by increasing the capacitance of the capacitor in the memory cell. On the other hand, the structure of this embodiment provides flexibility in changing the capacitance of the capacitor Cp2 in response to required read speed.

From the time t3 to the time t4, in the memory cell MC, when the read selection line RG is set at L level, the H-level potential of the wiring VS is supplied to the capacitor Cp2 through the transistor Tr2, and the potential of the node N2 increases and then reaches the H-level potential. In other words, the potential of the node N2 can be maintained after data reading without refresh operation.

From the time t4 to the time t5, the write selection line WG, the write data line WD, and the read selection line RG are set at L level.

Next, the timing chart in FIG. 2B will be described. FIG. 2B illustrates the case where data "0" (here, an L-level potential) is written into the memory cell MC.

From the time t6 to the time t7, the write selection line WG and the read selection line RG are set at H level, and the write data line WD and the read data line RD are set at L level. Thus, the potential of the node N1 in the memory cell MC becomes L level. Here, in the memory cell MC, the transistor Tr3 is turned on, so that the potential of the node N2 becomes L level and an L-level potential is held at the capacitor Cp2.

From the time t7 to the time t8, the write selection line WG, the write data line WD, and the read selection line RG are set at L level. Note that the potential of the read data line RD is a given potential, and an H-level or L-level potential is applied to the read data line RD by data writing in another row, for example.

From the time t8 to the time t9, data in the memory cell MC is read. Here, the read selection line RG is set at H level. Note that at the time t8, the potential of the read data line RD is preferably pulled down, that is, the potential of the read data line RD is preferably a ground potential corresponding to an L-level potential.

From the time t8 to the time t9, in the memory cell MC, capacitive coupling occurs between the capacitance of the capacitor Cp2 at L level and the parasitic capacitance of the read data line RD at L level through the transistor Tr3; however, the potentials of the capacitor Cp2 and the read data line RD remain at L level. Consequently, data can be read by detecting a change in the potential of the read data line RD.

From the time t9 to the time t10, the write selection line WG, the write data line WD, and the read selection line RG are set at L level.

As described above, data can be written into the memory cell MC and read from the memory cell MC as shown in the timing charts in FIGS. 2A and 2B.

Figure 3A:
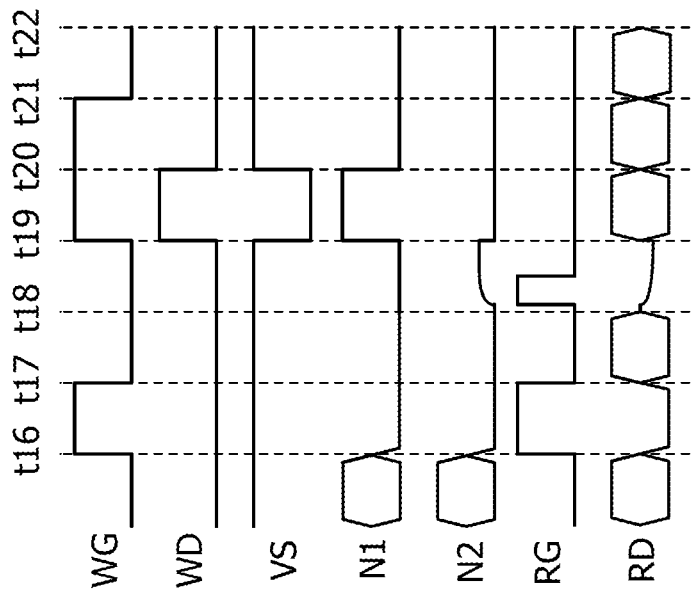
FIGS. 3A and 3B are timing charts of one embodiment of the present invention.
Figure 3B:
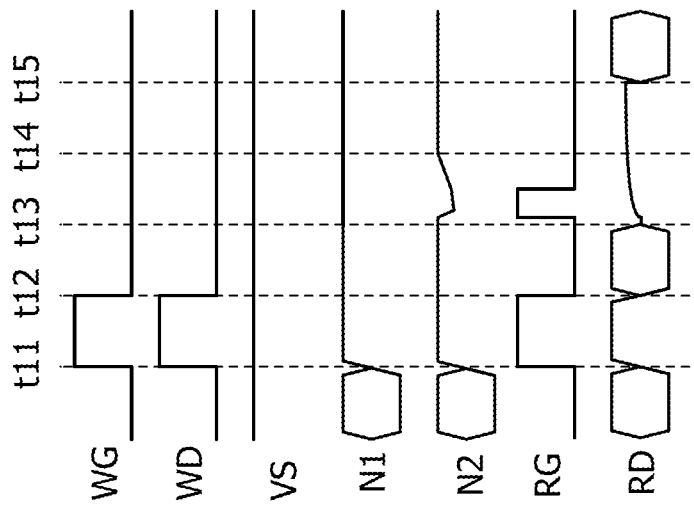

The timing charts in FIGS. 2A and 2B show the case where data is read using the read data line RD with a pulled-down potential; alternatively, data can be read using precharging of the read data line RD. The operation of reading data using a precharged read data line will be described with reference to timing charts in FIGS. 3A and 3B. The timing charts in FIGS. 3A and 3B show changes in the potentials of the write selection line WG, the write data line WD, the wiring VS, the node N1, the node N2, the read selection line RG, and the read data line RD from the time t11 to the time t22.

First, the timing chart in FIG. 3A will be described. FIG. 3A illustrates the case where data "1" (here, an H-level potential) is written into the memory cell MC.

Data writing operation from the time t11 to the time t13 is the same as the operation from the time t1 to the time t3 described using FIG. 2A, and the description thereof is not repeated.

From the time t13 to the time t14, data in the memory cell MC is read. Here, the read selection line RG is set at H level. At the time t13, the read data line RD is precharged at an intermediate potential between an H-level and L-level potentials (also referred to as precharge potential).

From the time t13 to the time t14, in the memory cell MC, capacitive coupling occurs between the capacitance of the capacitor Cp2 at H level and the parasitic capacitance of the read data line RD at the precharge potential through the transistor Tr3; thus, the potentials of the capacitor Cp2 and the read data line RD become higher than the precharge potential. Consequently, data can be read by detecting a change in the potential of the read data line RD. Providing a read circuit such as a sense amplifier that can read data by using such a small change in the potential of the read data line RD enables data reading at high speed.

Note that from the time t13 to the time t14, in the memory cell MC, while the read selection line RG is at H level, the H-level potential of the wiring VS is supplied to the capacitor Cp2 and the read data line RD through the transistor Tr2 and the transistor Tr3, and the potentials of the node N2 and the read data line RD increase. Accordingly, even when a change in the potential of the read data line RD due to capacitive coupling between the capacitance of the capacitor Cp2 and the parasitic capacitance of the read data line RD is small because of small capacitance of the capacitor Cp2, the amount of change in the potential of the read data line RD can be increased by making the time for reading data longer. In a general DRAM cell, the amount of change in the potential is increased only by making a potential change due to capacitive coupling larger, that is, by increasing the capacitance of the capacitor in the memory cell. On the other hand, the structure of this embodiment provides flexibility in changing the capacitance of the capacitor Cp2 in response to required read speed.

From the time t13 to the time t14, in the memory cell MC, when the read selection line RG is set at L level, the H-level potential of the wiring VS is supplied to the capacitor Cp2 through the transistor Tr2, and the potential of the node N2 increases and then reaches the H-level potential. In other words, the potential of the node N2 can be maintained after data reading without refresh operation.

From the time t14 to the time t15, the write selection line WG, the write data line WD, and the read selection line RG are set at L level.

Next, the timing chart in FIG. 3B will be described. FIG. 3B illustrates the case where data "0" (here, an L-level potential) is written into the memory cell MC.

Data writing operation from the time t16 to the time t18 is the same as the operation from the time t6 to the time t8 described using FIG. 2B, and the description thereof is not repeated.

From the time t18 to the time t19, data in the memory cell MC is read. Here, the read selection line RG is set at H level. At the time t18, the read data line RD is precharged at a precharge potential.

From the time t18 to the time t19, in the memory cell MC, capacitive coupling occurs between the capacitance of the capacitor Cp2 at L level and the parasitic capacitance of the read data line RD at the precharge potential through the transistor Tr3; however, the potentials of the capacitor Cp2 and the read data line RD become lower than the precharge potential. Thus, data can be read by detecting a change in the potential of the read data line RD. Providing a read circuit such as a sense amplifier that can read data by using such a small change in the potential of the read data line RD enables data reading at high speed.

Note that from the time t18 to the time t19, in the memory cell MC, the potential of the node N2 at the time t19 is higher than an L-level potential unlike in the period between the time t8 and the time t9 described using FIG. 2B. For this reason, read data is preferably refreshed in the operation in FIG. 3B. Specifically, refresh operation is performed from the time t19 to the time t21.

From the time t19 to the time t20, the write selection line WG and the write data line WD are set at H level, and the wiring VS and the read selection line RG are set at L level. Thus, the potential of the node N1 in the memory cell MC becomes H level. Here, in the memory cell MC, the transistor Tr2 is turned on, so that the potential of the node N2 becomes L level and an L-level potential is held at the capacitor Cp2.

Next, from the time t20 to the time t21, the write selection line WG and the wiring VS are set at H level, and the write data line WD and the read selection line RG are set at L level. Thus, the potential of the node N1 in the memory cell MC becomes L level. Here, in the memory cell MC, the transistor Tr2 and the transistor Tr3 are turned off, so that an L-level potential is held at the capacitor Cp2.

The case where refresh operation is performed from the time t19 to the time t21 is described above; when data is read by applying a precharge potential to the read data line RD, the design flexibility of a sense amplifier that is configured to sense data by using the magnitude relation with the precharge potential is increased, and the data reading sensitivity can be improved.

When the operation from the time t19 to the time t21 is performed on all the memory cells, the memory cells can be initialized. Thus, the potential of the node N2 is set at L level in advance, resulting in omission of the operation of writing data from the read data line RD through the transistor Tr3, which is performed from the time t1 to the time t2 in FIG. 2A and from the time t6 to the time t7 in FIG. 2B.

From the time t21 to the time t22, the write selection line WG, the write data line WD, and the read selection line RG are set at L level and the wiring VS is set at H level.

As described above, data can be written into the memory cell MC and read from the memory cell MC as shown in the timing charts in FIGS. 3A and 3B.

Figure 4:
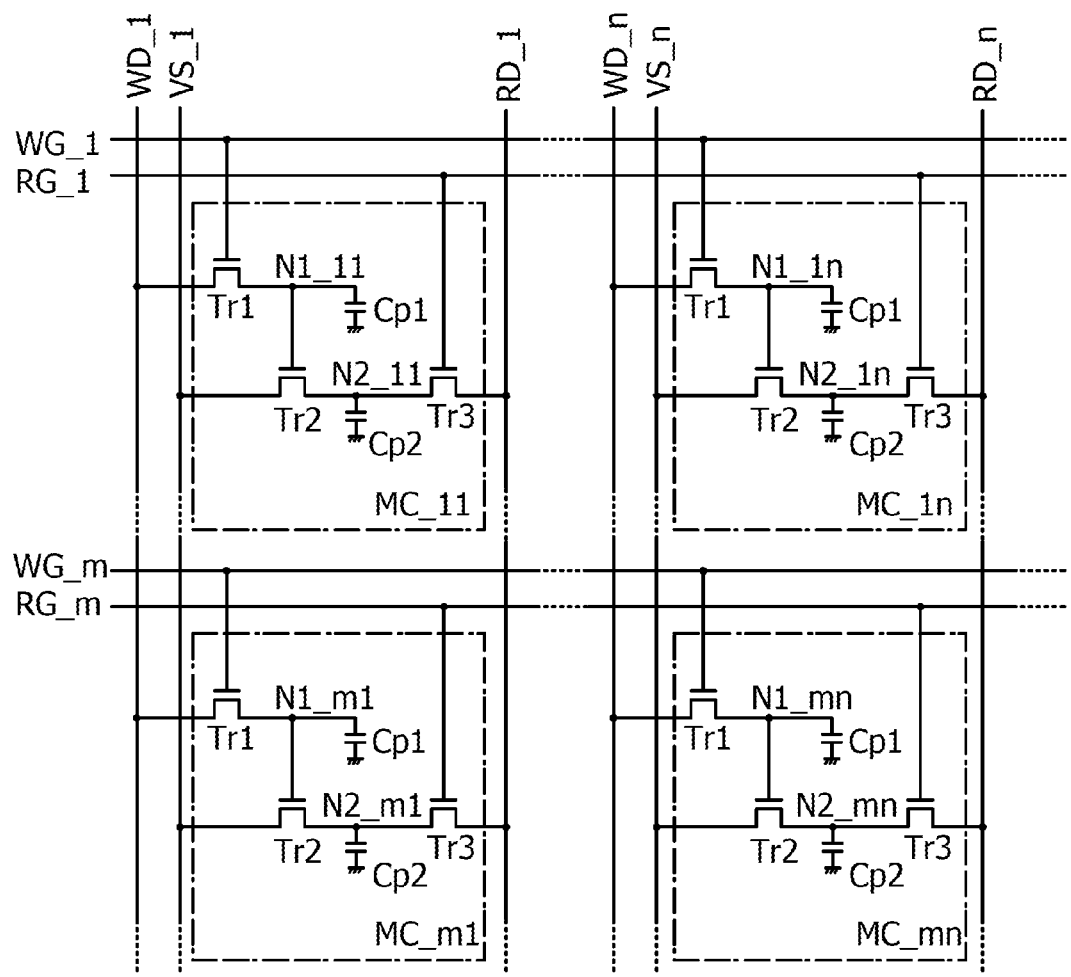
FIG. 4 is a circuit diagram of one embodiment of the present invention.

FIG. 4 is a circuit diagram of a semiconductor device in which memory cells MC are arranged in a matrix of m rows and n columns (m and n are each a natural number). FIG. 4 illustrates the semiconductor device including memory cells MC_11 to MC_mn. Note that the memory cell MC_11 represents a memory cell in the first row and the first column; the memory cell MC_1n, a memory cell in the first row and the n-th column; the memory cell MC_m1, a memory cell in the m-th row and the first column; and the memory cell MC_mn, a memory cell in the m-th row and the n-th column. The node N1 and the node N2 included in each of the memory cells MC_11 to MC_mn are represented in the same manner. For example, the node N1 in the memory cell MC_11 in the first row and the first column is represented as a node N1_11. The same applies to the nodes N1_1n to N1_mn and the nodes N2_11 to N2_mn.

As illustrated in FIG. 4, the memory cells MC_11 to MC_mn are connected to write selection lines WG_1 to WG_m, read selection lines RG_1 to RG_m, write data lines WD_1 to WD_n, wirings VS_1 to VS_n, and read data lines RD_1 to RD_n. Each of the memory cells MC_11 to MC_mn includes the transistor Tr1, the transistor Tr2, the transistor Tr3, the capacitor Cp1, and the capacitor Cp2 described using FIG. 1.

Figure 5:
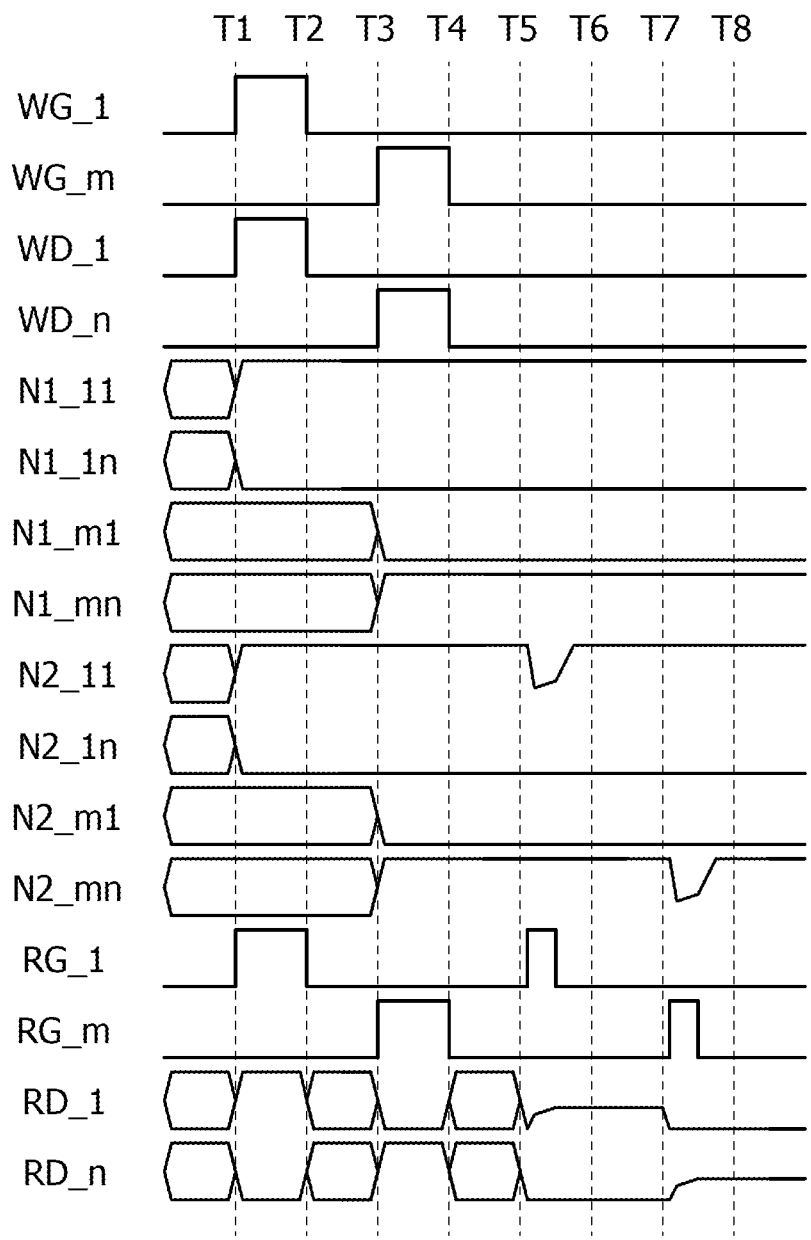
FIG. 5 is a timing chart of one embodiment of the present invention.

Next, an example of the operation of the memory cells MC_11 to MC_mn illustrated in FIG. 4 will be described using a timing chart in FIG. 5. In the following description, as data written into the memory cells MC_11 to MC_mn, an L-level potential is written to write data "0" and an H-level potential is written to write data "1". The timing chart in FIG. 5 shows changes in the potentials of the write selection lines WG_1 and WG_m, the write data lines WD_1 and WD_n, the node N1_11, the node N1_1n, the node N1_m1, the node N1_mn, the node N2_11, the node N2_1n, the node N2_m1, the node N2_mn, the read selection lines RG_1 and RG_m, and the read data lines RD_1 and RD_n from the time T1 to the time T8.

From the time T1 to the time T2, data "1" is written into the memory cell MC_11 and data "0" is written into the memory cell MC_1n in the first row. Specifically, the write selection line WG_1, the write data line WD_1, the read selection line RG_1, and the read data line RD_1 are set at H level and the write selection line WG_m, the write data line WD_n, the read selection line RG_m, and the read data line RD_n are set at L level. Thus, the potential of the node N1_11 in the memory cell MC_11 becomes H level and the potential of the node N1_1n in the memory cell MC_1n becomes L level. Here, in the memory cell MC_11, the transistor Tr2 and the transistor Tr3 are turned on, so that the potential of the node N2_11 becomes H level and the H-level potential is kept at the capacitor Cp2. In the memory cell MC_1n, the transistor Tr3 is turned on, whereby the potential of the node N2_1n becomes L level and the L-level potential is kept at the capacitor Cp2.

From the time T2 to the time T3, the write selection lines WG_1 and WG_m, the write data lines WD_1 and WD_n, and the read selection lines RG_1 and RG_m are set at L level. Note that the potentials of the read data lines RD_1 and RD_n are given potentials, and an H-level or L-level potential is applied to the read data lines RD_1 and RD_n by data writing in another row, for example.

From the time T3 to the time T4, data "0" is written into the memory cell MC_m1 and data "1" is written into the memory cell MC_mn in the m-th row. Specifically, the write selection line WG_1, the write data line WD_1, the read selection line RG_1, and the read data line RD_1 are set at L level and the write selection line WG_m, the write data line WDn, the read selection line RG_m, and the read data line RD_n are set at H level. Thus, the potential of the node N1_m1 in the memory cell MC_m1 becomes L level and the potential of the node N1_mn in the memory cell MC_mn becomes H level. Here, in the memory cell MC_m1, the transistor Tr3 is turned on, so that the potential of the node N2_m1 becomes L level and the L-level potential is kept at the capacitor Cp2. In the memory cell MC_mn, the transistor Tr2 and the transistor Tr3 are turned on, whereby the potential of the node N2_mn becomes H level and the H-level potential is kept at the capacitor Cp2.

From the time T4 to the time T5, the write selection lines WG_1 and WG_m, the write data lines WD_1 and WD_n, and the read selection lines RG_1 and RG_m are set at L level. Note that the potentials of the read data lines RD_1 and RD_n are given potentials, and an H-level or L-level potential is applied to the read data lines RD_1 and RD_n by data writing in another row, for example.

From the time T5 to the time T6, data in the memory cells MC_11 and MC_1n of the first row are read. Here, the read selection line RG_1 is set at H level and the read selection line RG_m is set at L level. Note that at the time T5, the potentials of the read data lines RD_1 and RD_n are pulled down, that is, these potentials are set at a ground potential corresponding to an L-level potential. Note that precharge may be performed as described using FIGS. 3A and 3B.

From the time T5 to the time T6, in the memory cell MC_11, capacitive coupling occurs between the capacitance of the capacitor Cp2 at H level and the parasitic capacitance of the read data line RD_1 at L level through the transistor Tr3; thus, the potentials of the capacitor Cp2 and the read data line RD_1 become higher than the L-level potential. Furthermore, in the memory cell MC_1n, capacitive coupling occurs between the capacitance of the capacitor Cp2 at L level and the parasitic capacitance of the read data line RD_n at L level through the transistor Tr3; however, the potentials of the capacitor Cp2 and the read data line RD_n remain at L level. Consequently, data can be read by detecting changes in the potentials of the read data lines RD_1 and RD_n.

From the time T5 to the time T6, in the memory cell MC_11, while the read selection line RG_1 is at H level, the H-level potential of the wiring VS is supplied to the capacitor Cp2 and the read data line RD_1 through the transistor Tr2 and the transistor Tr3, and the potentials of the node N2_11 and the read data line RD_1 increase. Accordingly, even when a change in the potential of the read data line RD_1 due to capacitive coupling between the capacitance of the capacitor Cp2 and the parasitic capacitance of the read data line RD_1 is small because of small capacitance of the capacitor Cp2, the amount of change in the potential of the read data line RD_1 can be increased by making the time for reading data longer. In a general DRAM cell, the amount of change in the potential is increased only by making a potential change due to capacitive coupling larger, that is, by increasing the capacitance of the capacitor in the memory cell. On the other hand, the structure of this embodiment provides flexibility in changing the capacitance of the capacitor Cp2 in response to required read speed.

From the time T5 to the time T6, in the memory cell MC_11, when the read selection line RG_1 is set at L level, the H-level potential of the wiring VS is supplied to the capacitor Cp2 through the transistor Tr2, and the potential of the node N2_11 increases and then reaches the H-level potential. In other words, the potential of the node N2_11 can be maintained after data reading without refresh operation.

From the time T6 to the time T7, the write selection line WG_1, the write selection line WG_m, the write data line WD_1, the write data line WD_n, the read selection line RG_1, and the read selection line RG_1 are set at L level.

From the time T7 to the time T8, data in the memory cells MC_m1 and MC_mn of the m-th row are read. Here, the read selection line RG_1 is set at L level and the read selection line RG_m is set at H level. Note that at the time T7, the potentials of the read data lines RD_1 and RD_n are pulled down, that is, these potentials are set at a ground potential corresponding to an L-level potential. Note that precharge may be performed as described using FIGS. 3A and 3B.

From the time T7 to the time T8, in the memory cell MC_m1, capacitive coupling occurs between the capacitance of the capacitor Cp2 at L level and the parasitic capacitance of the read data line RD_1 at L level through the transistor Tr3; however, the potentials of the capacitor Cp2 and the read data line RD_1 remain at L level. In the memory cell MC_mn, capacitive coupling occurs between the capacitance of the capacitor Cp2 at H level and the parasitic capacitance of the read data line RD_n at L level through the transistor Tr3; thus, the potentials of the capacitor Cp2 and the read data line RD_n become higher than the L-level potential. Consequently, data can be read by detecting changes in the potentials of the read data lines RD_1 and RD_n.

Note that from the time T7 to the time T8, in the memory cell MC_mn, while the read selection line RG_m is at H level, the H-level potential of the wiring VS is supplied to the capacitor Cp2 and the read data line RD_n through the transistor Tr2 and the transistor Tr3, and the potentials of the node N2_mn and the read data line RD_n increase. Accordingly, even when a change in the potential of the read data line RD_n due to capacitive coupling between the capacitance of the capacitor Cp2 and the parasitic capacitance of the read data line RD_n is small because the capacitance of the capacitor Cp2 is small, the amount of change in the potential of the read data line RD_n can be increased by making the time for reading data longer. In a general DRAM cell, the amount of change in the potential is increased only by making a potential change due to capacitive coupling larger, that is, by increasing the capacitance of the capacitor in the memory cell. On the other hand, the structure of this embodiment provides flexibility in changing the capacitance of the capacitor Cp2 in response to required read speed.

From the time T7 to the time T8, in the memory cell MC_mn, when the read selection line RG_m is set at L level, the H-level potential of the wiring VS is supplied to the capacitor Cp2 through the transistor Tr2, and the potential of the node N2_mn increases and then reaches the H-level potential. In other words, the potential of the node N2_mn can be maintained after data reading without refresh operation.

As described above, data can be written into the memory cells MC_11 to MC_mn and read from the memory cells MC_11 to MC_mn as shown in the timing chart in FIG. 5.

Figure 6:
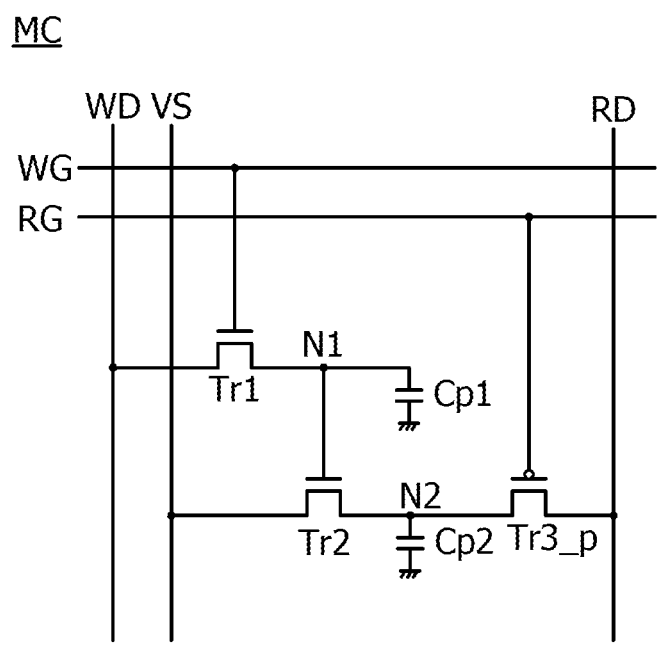
FIG. 6 is a circuit diagram of one embodiment of the present invention.

Although the transistors Tr1 to Tr3 are n-channel transistors in FIG. 1, some of them may be a p-channel transistor. For example, the transistor Tr3 can be a p-channel transistor Tr3_p as in a circuit diagram of FIG. 6.

Figure 7A:
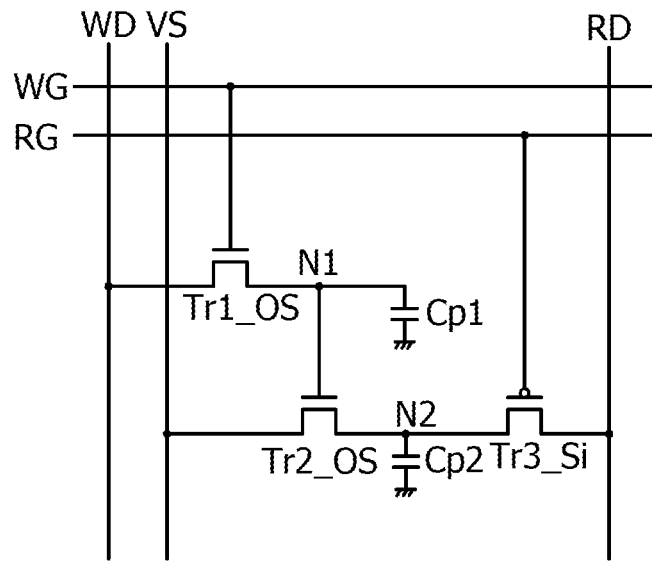
FIGS. 7A and 7B are circuit diagrams of one embodiment of the present invention.

In the structure illustrated in FIG. 1, the transistors Tr1 and Tr2 are OS transistors and the transistor Tr3 is a Si transistor. FIG. 7A is a circuit diagram in which "OS" is used to indicate that a semiconductor layer including a channel formation region of the OS transistor contains an oxide semiconductor and "Si" is used to indicate that a semiconductor layer including a channel formation region of the Si transistor contains silicon. In FIG. 7A, the transistor Tr1, the transistor Tr2, and the transistor Tr3 are shown as a transistor Tr1_OS, a transistor Tr2_OS, and a transistor Tr3_Si, respectively.

Figure 7B:
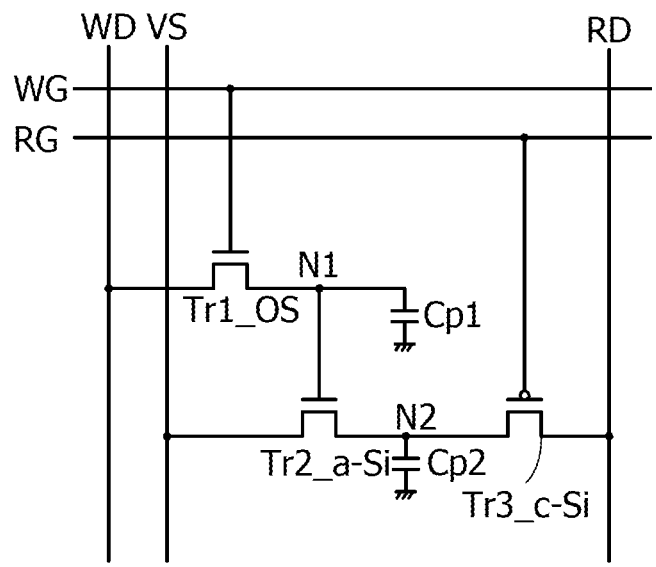

As described above, there is no particular limitation on the kind of semiconductor contained in the semiconductor layer of the transistor Tr2 because the transistor Tr2 only needs to have the feature of low gate leakage current. Thus, for example, the transistor Tr2 can be a transistor Tr2_a-Si containing amorphous silicon and the transistor Tr3 can be a transistor Tr3_c-Si containing single crystal silicon as illustrated in FIG. 7B. In this case, the three transistors are provided in different layers, so that the area of memory cells per unit area can be reduced.

As described above, one embodiment of the present invention achieves a nonvolatile semiconductor device in which charge retention characteristics of a node for holding charge are improved and data is read at high speed.

This embodiment can be implemented in appropriate combination with any of the other embodiments.

Embodiment 2

Referring to FIGS. 8 to 12, this embodiment will show an example of a semiconductor device including a matrix of the memory cells described in Embodiment 1.

<Structure Example of Semiconductor Device>

Figure 8:
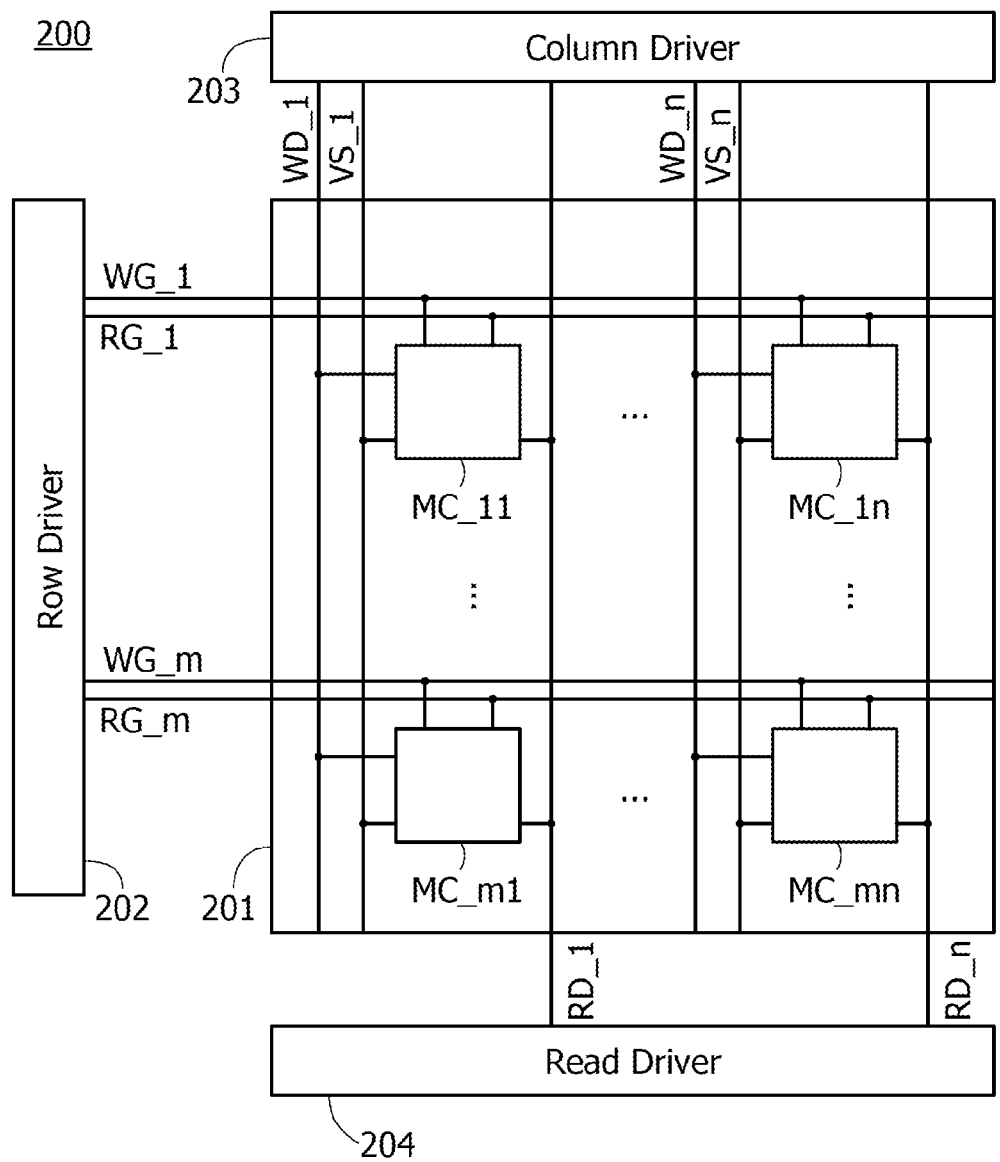
FIG. 8 is a block diagram of one embodiment of the present invention.

FIG. 8 is a block diagram illustrating a structure example of a semiconductor device including the memory cells MC arranged in a matrix in FIG. 4.

A semiconductor device 200 illustrated in FIG. 8 includes a memory cell array 201 in which the memory cells MC_11 to MC_mn described using FIG. 4 in Embodiment 1 are arranged in a matrix, a row driver 202, a column driver 203, and a read driver 204. FIG. 8 also illustrates wirings connected to the memory cell MC_11 in the first row and the first column, the memory cell MC_1n in the first row and the n-th column, the memory cell MC_m1 in the m-th row and the first column, and the memory cell MC_mn in the m-th row and the n-th column, specifically the write selection line WG_1, the read selection line RG_1, the write selection line WG_m, the read selection line RG_m, the read data line RD_1, the read data line RD_n, the wiring VS_1 for applying a constant potential, and the wiring VS_n for applying a constant potential.

The memory cell array 201 in FIG. 8 is the same as the semiconductor device in FIG. 4; therefore, the description thereof is omitted here and the description of FIG. 4 can be referred to.

The row driver 202 is a circuit having a function of selectively controlling data reading and writing in each row of the memory cells MC_11 to MC_mn. Specifically, the row driver 202 supplies a write selection signal and a read selection signal to the write selection lines WG_1 to WG_m and the read selection lines RG_1 to RG_m.

The column driver 203 is a circuit having a function of selectively writing data into the node N_1 in the memory cells MC_11 to MC_mn, and a function of supplying a potential corresponding to the data to the node N2 in the memory cells MC_11 to MC_mn. Specifically, the column driver 203 supplies data to the write data lines WD_1 to WD_n and the read data lines RD_1 to RD_n, and supplies the constant potential to the wirings VS_1 to VS_n.

The read driver 204 is a circuit having a function of reading data stored in the memory cells MC_11 to MC_mn and outputting the data to the outside. Specifically, the read driver 204 applies a precharge potential to the read data lines RD_1 to RD_n, reads in a voltage changed from the precharge potential, and outputs data obtained by comparing the voltage with a reference voltage to the outside.

Note that the wirings VS_1 to VS_n for applying a constant potential in FIG. 8 can be shared by adjacent memory cells. For example, as in a semiconductor device illustrated in a block diagram of FIG. 9, one wiring VS_1,2 can be provided instead of the wiring VS_1 in the first column and the wiring VS_2 in the second column.

<Structure Example of Row Driver>

Figure 10:
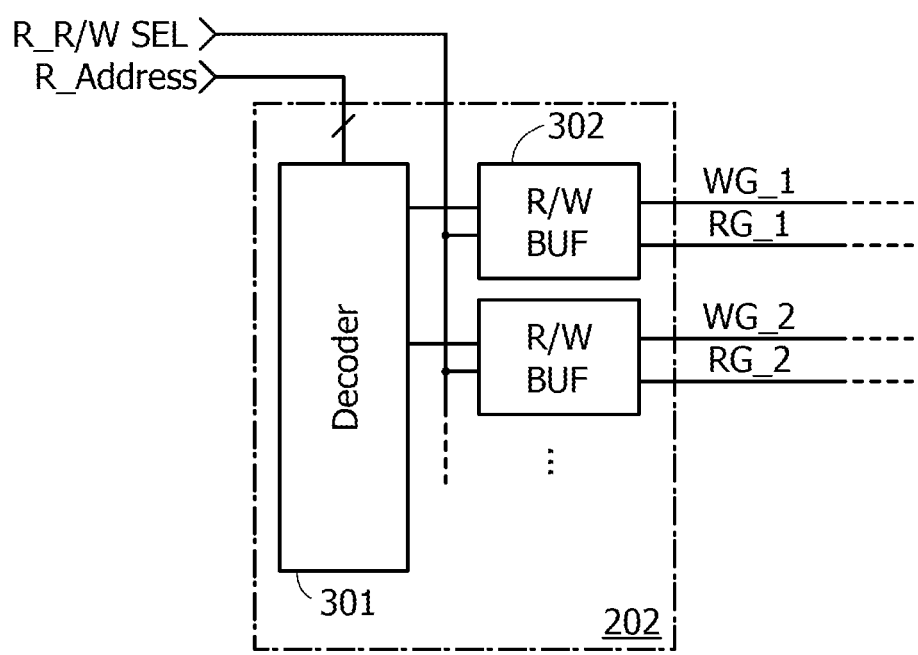
FIG. 10 is a block diagram of one embodiment of the present invention.

FIG. 10 is a block diagram showing a structure example of the row driver 202 illustrated in FIG. 8.

The row driver 202 illustrated in FIG. 10 includes a decoder 301 and read/write buffer circuits 302. The read/write buffer circuit 302 is provided for every row of the memory cells MC_11 to MC_mn, to which the write selection lines WG_1 to WG_m and the read selection lines RG_1 to RG_m are connected.

The decoder 301 is a circuit having a function of outputting a signal for selecting a row including one of the write selection lines WG_1 to WG_m and one of the read selection line RG_1 to RG_m. Specifically, the decoder 301 selects the read/write buffer circuits 302 in any row in accordance with an inputted row address signal R_Address.

The read/write buffer circuit 302 has functions of outputting a write selection signal and selectively outputting a read selection signal to a row selected by the decoder 301, which includes one of the write selection lines WG_1 to WG_m and one of the read selection lines RG_1 to RG_m. Specifically, the read/write buffer circuit 302 selectively outputs a write selection signal or a read selection signal in accordance with an inputted row read/write selection signal R_R/W_SEL.

<Structure Example of Column Driver>

Figure 11:
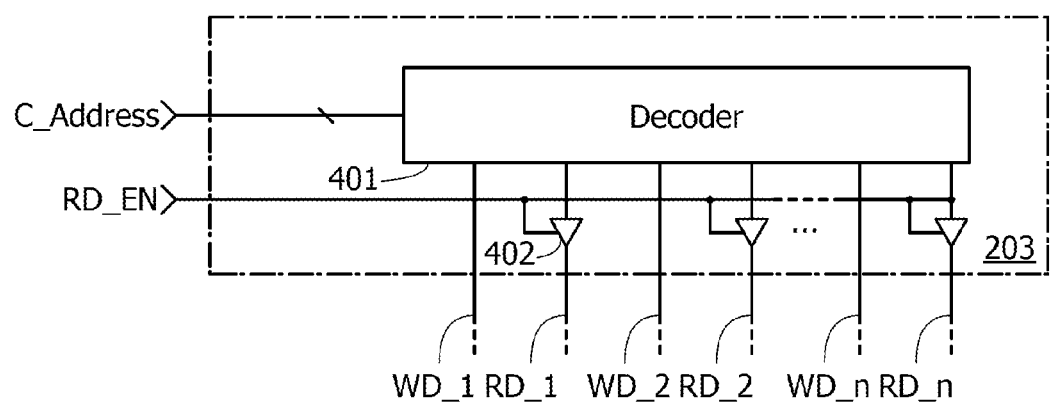
FIG. 11 is a block diagram of one embodiment of the present invention.

FIG. 11 is a block diagram showing a structure example of the column driver 203 illustrated in FIG. 8.

The column driver 203 illustrated in FIG. 11 includes a decoder 401 and three-state buffers 402. The decoder 401 is connected to the write data lines WD_1 to WD_n and the three-state buffers 402 of every column. The three-state buffers 402 are connected to the read data lines RD_1 to RD_n of the respective columns Although not shown, the wirings VS_1 to VS_n for applying a constant potential are connected to the memory cells MC_11 to MC_mn in the respective columns without being connected to the column driver 203 in FIG. 11.

The decoder 401 is a circuit having a function of selecting the write data lines WD_1 to WD_n and the read data lines RD_1 to RD_n to output data. Specifically, the decoder 401 is supplied with a column address signal C_Address and outputs data to the write data lines WD_1 to WD_n and the read data lines RD_1 to RD_n in a selected column.

The three-state buffers 402 are circuits for controlling whether a potential corresponding to data is applied to the read data lines RD_1 to RD_n or the read data lines RD_1 to RD_n are brought into an electrically floating state depending on a read data line control signal RD_EN. The read data lines RD_1 to RD_n are brought into a floating state at least in a period during which a ground potential or a precharge potential is applied to the read data lines RD_1 to RD_n to read data in a memory cell.

<Structure Example of Read Driver>

Figure 12:
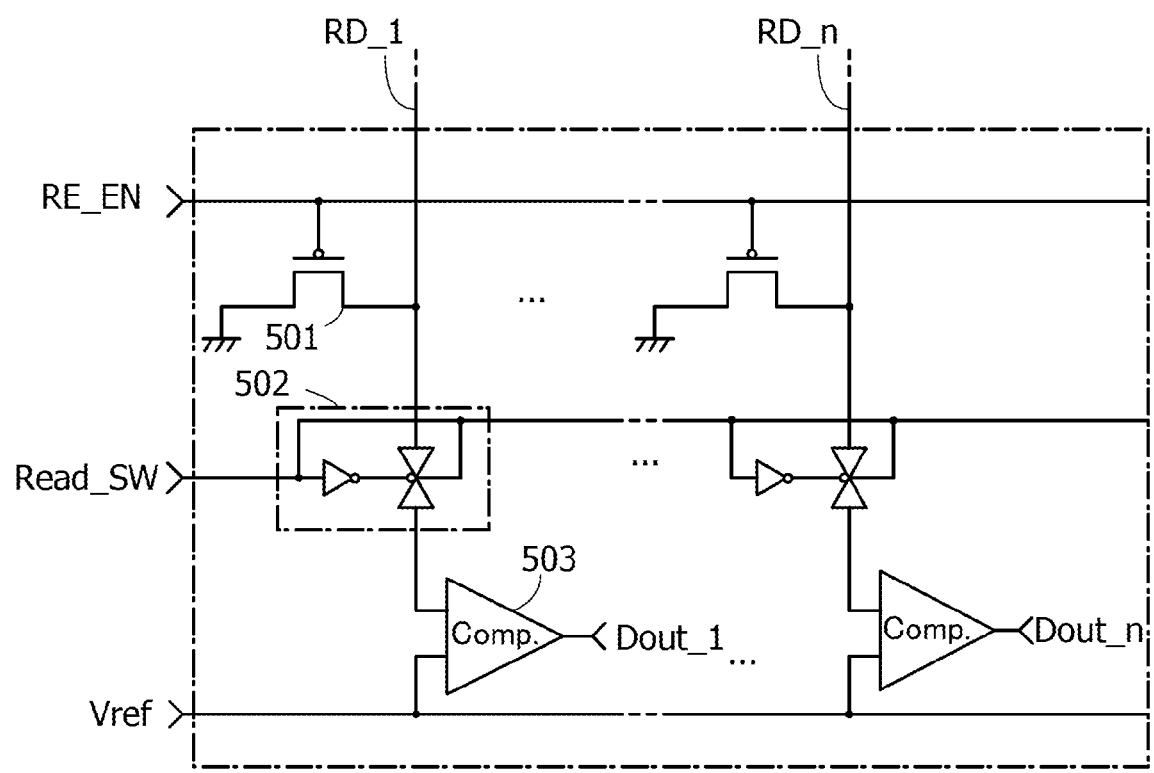
FIG. 12 is a block diagram of one embodiment of the present invention.

FIG. 12 is a block diagram showing a structure example of the read driver 204 illustrated in FIG. 8.

The read driver 204 illustrated in FIG. 12 includes transistors 501, switch circuits 502, and comparators 503. The transistor 501, the switch circuit 502, and the comparator 503 are provided in each column corresponding to the read data lines RD_1 to RD_n. The comparators 503 in each column are connected to respective output terminals Dout_1 to Dout_n connected to the outside.

The transistors 501 have a function of applying a ground potential for pull-down to the read data lines RD_1 to RD_n. Specifically, the transistors 501 are switches for applying a ground potential to the read data lines RD_1 to RD_n in response to a read control signal RE_EN. Note that the transistors 501 may have a function of applying a precharge potential to the read data lines RD_1 to RD_n. Specifically, the transistors 501 may be switches for applying a precharge potential to the read data lines RD_1 to RD_n in response to a read control signal RE_EN.

The switch circuits 502 have a function of supplying potentials of the read data lines RD_1 to RD_n that vary with data stored in the memory cells MC_11 to MC_mn to one of input terminals of the respective comparators 503. Specifically, the switch circuit 502 includes an analog switch and an inverter. Moreover, the switch circuit 502 supplies the potential of one of the read data lines RD_1 to RD_n to one of the input terminals of the comparator 503 in response to a switch control signal Read_SW, and the analog switch is subsequently turned off Note that the potential of one of the read data lines RD_1 to RD_n, which is applied to one of the input terminals of the comparator 503, may be held at the one input terminal of the comparator 503 by using a sample-hold circuit or the like.

The comparator 503 compares the potential of one of the read data lines RD_1 to RD_n, which is applied to one of the input terminals, with a reference voltage Vref applied to the other input terminal to determine a change in the potential of one of the read data lines RD_1 to RD_n. Signals corresponding to the determination results can be output to the outside through the output terminals Dout_1 to Dout_n. Note that the reference voltage Vref is a ground potential in the case where data is read using the read data lines RD_1 to RD_n with pulled-down potentials. Furthermore, the reference voltage Vref is a precharge potential in the case where data is read using the precharged read data lines RD_1 to RD_n.

As described above, the memory cells included in the semiconductor device described in this embodiment have the structure described in Embodiment 1, thereby achieving a nonvolatile semiconductor device in which charge retention characteristics of a node for holding charge are improved and data is read at high speed.

The structure described above in this embodiment can be combined as appropriate with any of the structures described in the other embodiments.

Embodiment 3

This embodiment will explain an oxide semiconductor layer that can be used as a semiconductor layer including a channel formation region of the transistor with low off-state current described in the foregoing embodiments.

An oxide semiconductor used for the semiconductor layer including a channel formation region of the transistor preferably contains at least indium (In) or zinc (Zn). In particular, the oxide semiconductor preferably contains both In and Zn. The oxide semiconductor preferably contains a stabilizer for strongly bonding oxygen, in addition to In and Zn. The oxide semiconductor preferably contains at least one of gallium (Ga), tin (Sn), zirconium (Zr), hafnium (Hf), and aluminum (Al) as the stabilizer.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor used for the semiconductor layer including a channel formation region of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, an In—Ga—Zn-based oxide with an atomic ratio of In:Ga:Zn=1:1:1, 3:1:2, or 2:1:3 or an oxide with an atomic ratio close to the above atomic ratios can be used.

If an oxide semiconductor film forming the semiconductor layer including a channel formation region contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is sometimes reduced by the dehydration treatment (dehydrogenation treatment). For that reason, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment or treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film that is extremely close to an i-type oxide semiconductor film. Note that "substantially intrinsic" means that the oxide semiconductor film contains extremely few (close to zero) carriers derived from a donor and has a carrier density of $1 \times 10^{17}/cm^3$ or lower, $1 \times 10^{16}/cm^3$ or lower, $1 \times 10^{15}/cm^3$ or lower, $1 \times 10^{14}/cm^3$ or lower, or $1 \times 10^{13}/cm^3$ or lower.

The transistor including an i-type or substantially i-type oxide semiconductor film can have extremely favorable leakage current characteristics. For example, the off-state drain current of the transistor including the oxide semiconductor film can be $1 \times 10^{-18}$ A or less, preferably $1 \times 10^{-21}$ A or less, more preferably $1 \times 10^{-24}$ A or less at room temperature (approximately 25° C.), or $1 \times 10^{-15}$ A or less, preferably $1 \times 10^{-18}$ A or less, more preferably $1 \times 10^{-21}$ A or less at 85° C. Note that the off state of an n-channel transistor refers to a state where a gate voltage is sufficiently lower than the threshold voltage. Specifically, the transistor is off when the gate voltage is lower than the threshold voltage by 1 V or more, 2 V or more, or 3 V or more.

An oxide semiconductor film may include a non-single crystal, for example. The non-single crystal state is structured, for example, by at least one of c-axis aligned crystal (CAAC), polycrystal, microcrystal, and an amorphous part.

An oxide semiconductor may include CAAC, for example. Note that an oxide semiconductor including CAAC is referred to as a c-axis aligned crystalline oxide semiconductor (CAAC-OS).

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is less than 100 nm, for example. In an image of the CAAC-OS obtained with a TEM, a boundary between the crystal parts or a grain boundary is not clearly observed in some cases. Since a clear grain boundary does not exist in the CAAC-OS, segregation of an impurity, high density of defect states, or a reduction in electron mobility is unlikely to occur, for example.

For example, the CAAC-OS sometimes includes a plurality of crystal parts whose c-axes are aligned in a direction parallel to a normal vector of a surface where the CAAC-OS is formed or a normal vector of a surface of the CAAC-OS. When the CAAC-OS is analyzed by an out-of-plane method with an X-ray diffraction (XRD) apparatus, a peak at $2\theta$ of around 31° which shows alignment appears in some cases. Furthermore, for example, spots (luminescent spots) are observed in an electron diffraction pattern of the CAAC-OS in some cases. Note that an electron diffraction pattern obtained with an electron beam having a beam diameter of 10 nm$\phi$ or smaller or 5 nm$\phi$ or smaller is called a nanobeam electron diffraction pattern. In the CAAC-OS, for example, among crystal parts, the directions of the a-axis and the b-axis of one crystal part are sometimes different from those of another crystal part. In the CAAC-OS, for example, c-axes are aligned and a-axes and/or b-axes are not macroscopically aligned in some cases.

In each of the crystal parts included in the CAAC-OS, for example, the c-axis is aligned in a direction parallel to a normal vector of a surface where the CAAC-OS is formed or a normal vector of a surface of the CAAC-OS, metal atoms are arranged in a triangular or hexagonal pattern when seen from the direction perpendicular to the a-b plane, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part.

The CAAC-OS can be formed by reduction in the density of defect states, for example. In an oxide semiconductor, for example, oxygen vacancies are defect states. Oxygen vacancies serve as trap levels or serve as carrier generation sources when hydrogen is trapped therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has low density of trap states in some cases. Thus, the transistor including the oxide semiconductor in the channel formation region has a small change in electrical characteristics and high reliability in some cases. A charge trapped by the trap states in the oxide semiconductor takes a long time to disappear. The trapped charge may behave like a fixed charge. Consequently, the transistor that contains the oxide semiconductor having a high density of trap states in the channel formation region has unstable electrical characteristics in some cases.

With the use of the highly purified intrinsic or substantially highly purified intrinsic CAAC-OS in a transistor, a change in the electrical characteristics of the transistor due to irradiation with visible light or ultraviolet light is small.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

An oxide semiconductor may include microcrystal, for example. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor ranges from 1 nm to 100 nm, or from 1 nm to 10 nm, for example. A microcrystal with a size ranging from 1 nm to 10 nm is specifically referred to as nanocrystal (nc). An oxide semiconductor including nanocrystal is referred to as a nanocrystalline oxide semiconductor (nc-OS). In an image of the nc-OS obtained with a TEM, for example, a boundary between crystal parts is not clearly observed in some cases. Since a clear grain boundary does not exist in an image of the nc-OS obtained with a TEM, for example, segregation of an impurity is unlikely to occur. In the nc-OS, since a clear grain boundary does not exist, high density of defect states or a reduction in electron mobility is unlikely to occur, for example.

In the nc-OS, for example, a microscopic region (e.g., a region ranging from 1 nm to 10 nm) has a periodic atomic order occasionally. Furthermore, for example, in the nc-OS, crystal parts are not regularly arranged. Thus, there is a case where periodic atomic order is not observed macroscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than the diameter of a crystal part, a peak that shows alignment does not appear in some cases. Moreover, for example, a halo pattern is shown in some cases in an electron diffraction pattern of the nc-OS obtained by using an electron beam having a beam diameter larger than the diameter of a crystal part (e.g., a beam diameter of 20 nm$\phi$ or more, or 50 nm$\phi$ or more). For example, spots are shown in some cases in a nanobeam electron diffraction pattern of the nc-OS obtained by using an electron beam having a beam diameter smaller than or equal to the diameter of a crystal part (e.g., a beam diameter of 10 nm$\phi$ or less, or 5 nm$\phi$ or less). In a nanobeam electron diffraction pattern of the nc-OS, for example, regions with high luminance in a circular pattern are shown in some cases. Moreover, in a nanobeam electron diffraction pattern of the nc-OS, for example, a plurality of spots are shown in the region in some cases.

Since the microscopic region in the nc-OS has a periodic atomic order occasionally, the nc-OS has lower density of defect states than the amorphous oxide semiconductor. Note that since crystal parts in the nc-OS are not regularly arranged, the nc-OS has higher density of defect states than the CAAC-OS.

Note that an oxide semiconductor film may be a mixed film including two or more of a CAAC-OS, a polycrystalline oxide semiconductor, a microcrystalline oxide semiconductor, and an amorphous oxide semiconductor. The mixed film may include at least two of an amorphous oxide semiconductor region, a microcrystalline oxide semiconductor region, a polycrystalline oxide semiconductor region, and a CAAC-OS region, for example. Moreover, the mixed film may have a stacked structure of at least two of an amorphous oxide semiconductor region, a microcrystalline oxide semiconductor region, a polycrystalline oxide semiconductor region, and a CAAC-OS region.

This embodiment can be implemented in appropriate combination with any of the other embodiments.

Embodiment 4

Referring to a drawing, this embodiment will show a cross-sectional structure of transistors included in the memory cell MC of the semiconductor device of one embodiment of the disclosed invention.

Figure 13:
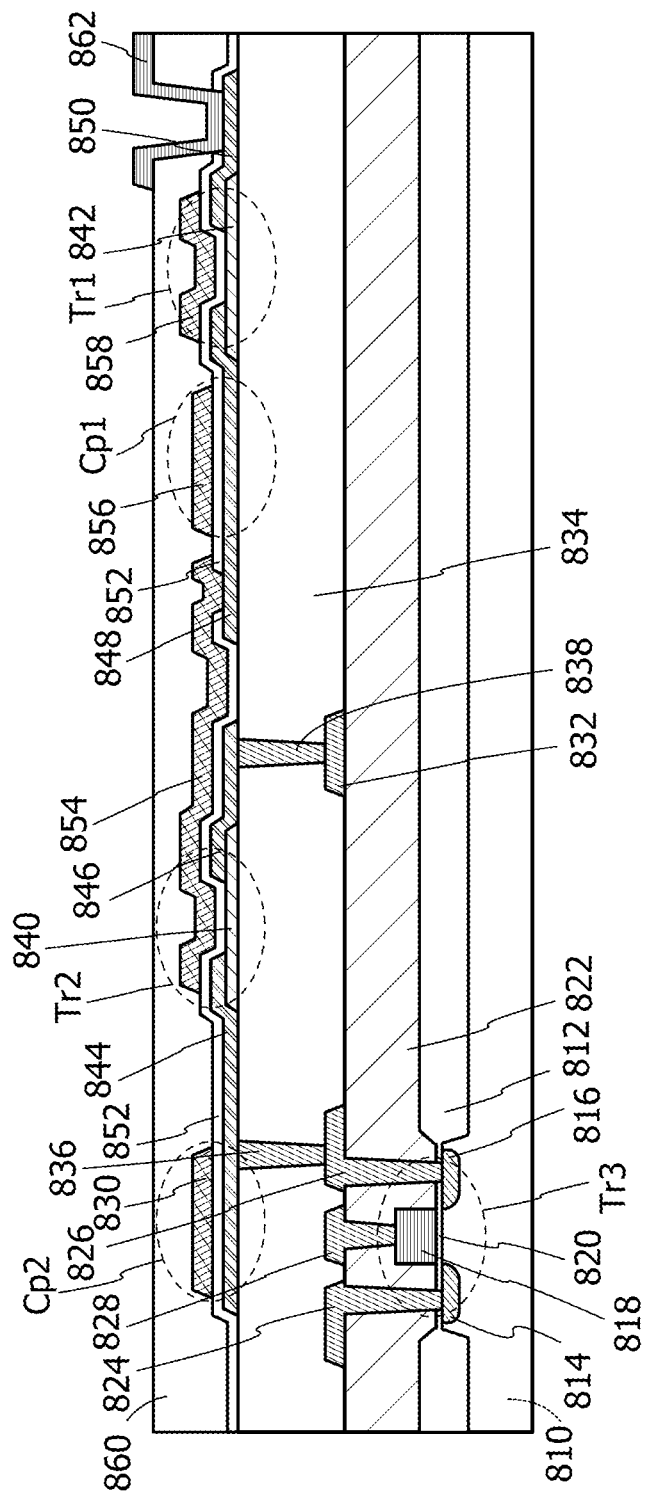
FIG. 13 is a cross-sectional view of one embodiment of the present invention.

FIG. 13 illustrates an example of part of a cross-sectional structure of the memory cell MC. FIG. 13 illustrates the transistor Tr1, the transistor Tr2, the transistor Tr3, the capacitor Cp1, and the capacitor Cp2 shown in Embodiment 1.

In the cross-sectional view in FIG. 13, the transistors Tr1 to Tr3 and the capacitors Cp1 and Cp2 shown in FIG. 1 are denoted by the same reference signs.

The cross-sectional view in FIG. 13 shows an example where the transistor Tr3 is formed on a single crystal silicon substrate and the transistors Tr1 and Tr2 using an oxide semiconductor for a semiconductor layer including a channel formation region are formed over the transistor Tr3. In the transistor Tr3, a thin semiconductor layer of silicon, germanium, or the like in an amorphous, microcrystalline, polycrystalline, or single crystal state may be used for the semiconductor layer including a channel formation region.

In the cross-sectional view in FIG. 13, the transistors Tr1 and Tr2 are transistors in which an oxide semiconductor provided in the same layer is used for a semiconductor layer including a channel formation region. Alternatively, the transistors Tr1 and Tr2 may be provided in different layers and stacked as described in Embodiment 1. In this structure, the transistor Tr2 does not necessarily use an oxide semiconductor for the semiconductor layer including a channel formation region as long as the transistor Tr2 includes a thicker gate insulating film than the transistor Tr3. With such a structure, the density of memory cells can be further increased.

When the Si transistor and the OS transistors are stacked in the semiconductor device as in FIG. 13, the chip area of the semiconductor device can be reduced.

In FIG. 13, the n-channel transistor Tr3 is formed on a semiconductor substrate 810.

The semiconductor substrate 810 can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate). In FIG. 13, a single crystal silicon substrate having n-type conductivity is used.

The transistor Tr3 is electrically isolated from other transistors existing in the same layer by element isolation insulating films 812. The element isolation insulating films 812 can be formed by a local oxidation of silicon (LOCOS) method, a trench isolation method, or the like.

Specifically, the transistor Tr3 includes impurity regions 814 and 816 that are formed in the semiconductor substrate 810 and function as source and drain regions, a conductive film 818, and a gate insulating film 820 provided between the semiconductor substrate 810 and the conductive film 818. The conductive film 818 overlaps a channel formation region between the impurity regions 814 and 816 with the gate insulating film 820 positioned between the conductive film 818 and the channel formation region. Note that the conductive film 818 functions as a gate electrode.

An insulating film 822 is provided over the transistor Tr3. Openings are formed in the insulating film 822. A conductive film 824 in contact with the impurity region 814, a conductive film 826 in contact with the impurity region 816, and a conductive film 828 in contact with the conductive film 818 are formed in the openings. A conductive film 832 is formed in the same layer as the conductive films 824, 826, and 828.

An insulating film 834 is provided over the conductive films 824, 826, 828, and 832. Openings are formed in the insulating film 834. A conductive film 836 that is a wiring in contact with the conductive film 826 and a conductive film 838 in contact with the conductive film 832 are formed in the openings.

In FIG. 13, the transistor Tr1, the transistor Tr2, the capacitor Cp1, and the capacitor Cp2 are formed over the insulating film 834.

The transistor Tr1 includes, over the insulating film 834, a semiconductor layer 842 containing an oxide semiconductor, conductive films 848 and 850 that are positioned over the semiconductor layer 842 and function as source and drain electrodes, a gate insulating film 852 over the semiconductor layer 842 and the conductive films 848 and 850, and a conductive film 858 that is positioned over the gate insulating film 852 and overlaps the semiconductor layer 842 between the conductive films 848 and 850. Note that the conductive film 858 functions as a gate electrode.

The transistor Tr2 includes, over the insulating film 834, a semiconductor layer 840 containing an oxide semiconductor, conductive films 844 and 846 that are positioned over the semiconductor layer 840 and function as source and drain electrodes, the gate insulating film 852 over the semiconductor layer 840 and the conductive films 844 and 846, and a conductive film 854 that is positioned over the gate insulating film 852 and has a portion functioning as a gate electrode in a region overlapping the semiconductor layer 840 without overlapping the conductive films 844 and 846. The conductive film 844 is connected to the conductive film 836. The conductive film 846 is connected to the conductive film 838. An opening reaching the conductive film 848 is formed in the gate insulating film 852. A conductive film 854 is provided in the opening.

The capacitor Cp1 includes, over the insulating film 834, the conductive film 848, the gate insulating film 852 over the conductive film 848, and a conductive film 856 which is over the gate insulating film 852 and part of which overlaps the conductive film 848.

The capacitor Cp2 includes, over the insulating film 834, the conductive film 844, the gate insulating film 852 over the conductive film 844, and a conductive film 830 which is over the gate insulating film 852 and part of which overlaps the conductive film 844.

An opening reaching the conductive film 850 is formed in the gate insulating film 852 and an insulating film 860. A conductive film 862 is provided in the opening.

Note that the conductive film 858 is a wiring corresponding to the write selection line WG described in Embodiment 1; the conductive film 832, a wiring corresponding to the wiring VS; the conductive films 848 and 854, a wiring corresponding to the node N1; the conductive films 826, 836, and 844, a wiring corresponding to the node N2; the conductive film 862, a wiring corresponding to the write data line WD; and the conductive film 824, a wiring corresponding to the read data line RD.

As the gate insulating films 820 and 852, an inorganic insulating film may be used, for example. The inorganic insulating film preferably has a single-layer or multi-layer structure including any of a silicon nitride film, a silicon oxynitride film, a silicon nitride oxide film, and the like.

Each of the insulating films 822, 834, and 860 is preferably a single layer or a multilayer including an inorganic insulating film or an organic insulating film. The organic insulating film preferably has a single-layer or a multi-layer structure containing polyimide, acrylic, or the like.

The semiconductor layers 840 and 842 are preferably formed using an oxide semiconductor. The oxide semiconductor can be any of the materials described in Embodiment 3.

Each of the conductive films 818, 824, 826, 828, 830, 832, 836, 838, 844, 846, 848, 850, 854, 856, 858, and 862 can be, for example, a single layer or a stack containing a metal material such as aluminum, copper, titanium, tantalum, or tungsten.

In FIG. 13, the transistors Tr1 and Tr2 have the gate electrode on at least one side of the semiconductor layer; alternatively, they may have a pair of gate electrodes with the semiconductor layer positioned therebetween.

When the transistors Tr1 and Tr2 include a pair of gate electrodes with the semiconductor layer positioned therebetween, one of the gate electrodes may be supplied with a signal for controlling the on/off state, and the other of the gate electrodes may be supplied with a potential from another element. In the latter case, potentials with the same level may be supplied to the pair of gate electrodes, or a fixed potential such as a ground potential may be supplied only to the other of the gate electrodes. When the level of a potential supplied to the other of the gate electrodes is controlled, the threshold voltage of the transistors Tr1 and Tr2 can be controlled.

The semiconductor layers 840 and 842 are not limited to a single film of an oxide semiconductor and may be a stack including a plurality of oxide semiconductor films.

The structure of the semiconductor device described in this embodiment achieves a nonvolatile semiconductor device in which charge retention characteristics of a node for holding charge are improved and data is read at high speed as described in Embodiment 1.

This embodiment can be implemented in appropriate combination with any of the other embodiments.

Embodiment 5

In this embodiment, application examples of the semiconductor device described in the foregoing embodiment to an electronic component and to an electronic device including the electronic component will be described with reference to FIGS. 14A and 14B and FIGS. 15A to 15E.

Figure 14A:
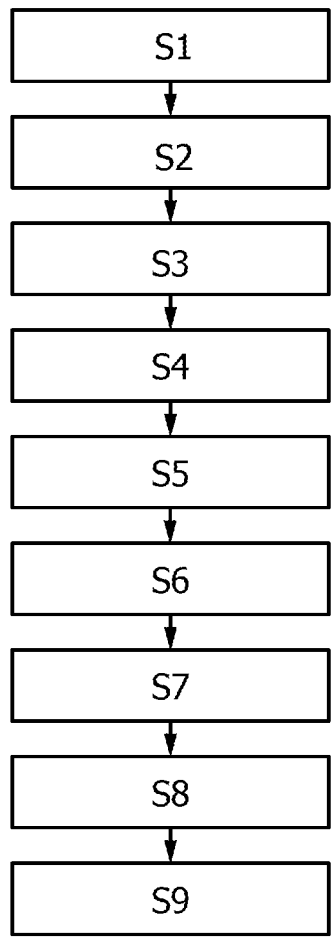
FIG. 14A is a flowchart showing fabrication steps of a semiconductor device.

FIG. 14A shows an example where the semiconductor device described in the foregoing embodiment is used to make an electronic component. Note that an electronic component is also referred to as semiconductor package or IC package. For the electronic component, there are various standards and names corresponding to the direction of terminals or the shape of terminals; hence, one example of the electronic component will be described in this embodiment.

A semiconductor device including the transistors illustrated in FIG. 13 of Embodiment 4 is completed by integrating detachable components on a printed circuit board through the assembly process (post-process).

The post-process can be completed through steps shown in FIG. 14A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, resin bonding, tape-automated bonding, or the like is selected as appropriate depending on products. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, so that the circuit portion and the wire embedded in the component can be protected from external mechanical force and deterioration of characteristics due to moisture or dust can be reduced.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

Since the electronic component described above includes the semiconductor device of the foregoing embodiment, it is possible to obtain an electronic component including the semiconductor device that excels in charge retention characteristics and can be subjected to data reading through the Si transistor even if leakage current due to downsizing of the Si transistor occurs. The electronic component has excellent data retention characteristics and high data read speed because it includes the semiconductor device of the foregoing embodiment.

Figure 14B:
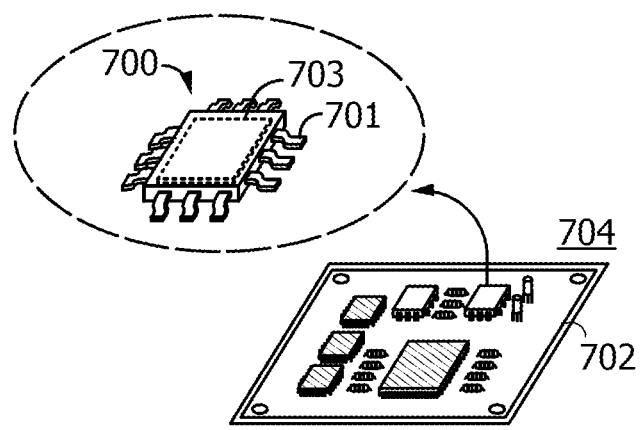
FIG. 14B is a perspective schematic view of the semiconductor device.

FIG. 14B is a perspective schematic diagram of a completed electronic component. FIG. 14B shows a perspective schematic diagram of a quad flat package (QFP) as an example of the electronic component. An electronic component 700 illustrated in FIG. 14B includes a lead 701 and a semiconductor device 703. The electronic component 700 in FIG. 14B is, for example, mounted on a printed circuit board 702. A plurality of electronic components 700 are used in combination and electrically connected to each other over the printed wiring board 702; thus, a substrate on which the electronic components are mounted (a circuit board 704) is completed. The completed circuit board 704 is provided in an electronic device or the like.

Next, the description is made on applications of the above electronic component to electronic devices such as a computer, a portable information appliance (including a mobile phone, a portable game machine, and an audio reproducing device), electronic paper, a television device (also referred to as television or television receiver), and a digital video camera.

Figure 15A:
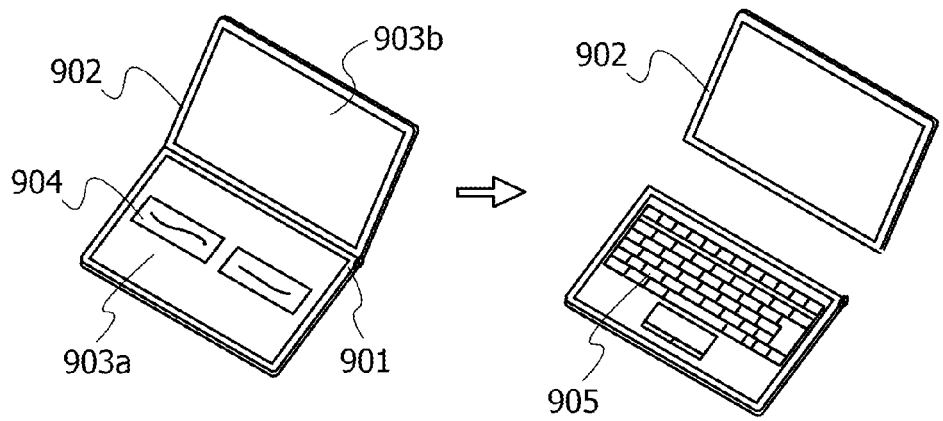
FIGS. 15A to 15E each illustrate an electronic device including a semiconductor device.

FIG. 15A illustrates a portable information appliance that includes a housing 901, a housing 902, a first display portion 903*a*, a second display portion 903*b*, and the like. At least one of the housings 901 and 902 includes the circuit board including the semiconductor device of the foregoing embodiment. Thus, it is possible to obtain a portable information appliance with excellent charge retention characteristics and high data read speed.

Note that the first display portion 903*a* is a panel having a touch input function, and for example, as illustrated in the left of FIG. 15A, which of "touch input" and "keyboard input" is performed can be selected by a selection button 904 displayed on the first display portion 903*a*. Since selection buttons with a variety of sizes can be displayed, the information appliance can be easily used by people of any generation. For example, when "keyboard input" is selected, a keyboard 905 is displayed on the first display portion 903*a* as illustrated in the right of FIG. 15A. Thus, letters can be input quickly by key input as in the case of using a conventional information appliance, for example.

One of the first display portion 903*a* and the second display portion 903*b* can be detached from the portable information appliance as shown in the right of FIG. 15A. Providing the second display portion 903*b* with a touch input function makes the information appliance convenient to carry because the weight can be further reduced and the information appliance can operate with one hand while the other hand supports the housing 902.

The portable information appliance in FIG. 15A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information appliance illustrated in FIG. 15A may transmit and receive data wirelessly. Through wireless communication, desired book data or the like can be purchased and downloaded from an e-book server.

In addition, the housing 902 illustrated in FIG. 15A may be equipped with an antenna, a microphone function, or a wireless communication function to be used as a mobile phone.

Figure 15B:
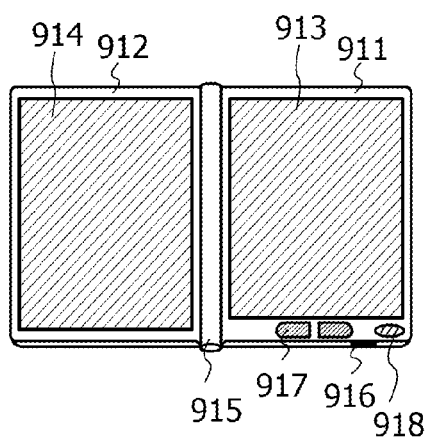

FIG. 15B illustrates an e-book reader in which electronic paper is incorporated. The e-book reader has two housings of a housing 911 and a housing 912. The housing 911 and the housing 912 are provided with a display portion 913 and a display portion 914, respectively. The housings 911 and 912 are connected by a hinge 915 and can be opened or closed with the hinge 915 as an axis. The housing 911 is provided with a power switch 916, an operation key 917, a speaker 918, and the like. The circuit board including the semiconductor device of the foregoing embodiment is provided in at least one of the housings 911 and 912. Consequently, it is possible to obtain an e-book reader with excellent charge retention characteristics and high data read speed.

Figure 15C:
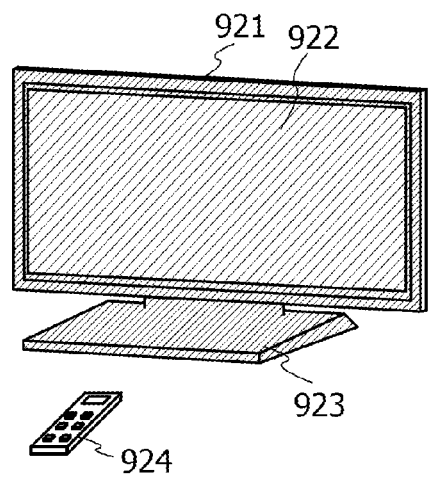

FIG. 15C illustrates a television device including a housing 921, a display portion 922, a stand 923, and the like. The television device can operate with a switch of the housing 921 and a separate remote controller 924. The circuit board including the semiconductor device of the foregoing embodiment is mounted on the housings 921 and the remote controller 924. Thus, it is possible to obtain a television with excellent charge retention characteristics and high data read speed.

Figure 15D:
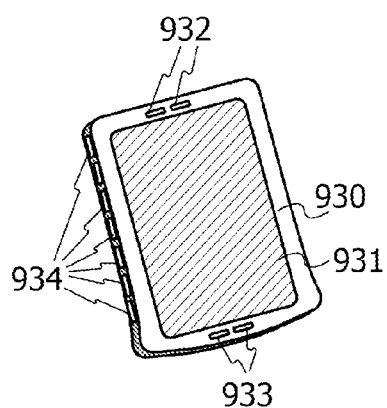

FIG. 15D illustrates a smartphone in which a main body 930 is provided with a display portion 931, a speaker 932, a microphone 933, an operation key 934, and the like. The circuit board including the semiconductor device of the foregoing embodiment is provided in the main body 930. Thus, it is possible to obtain a smartphone with excellent charge retention characteristics and high data read speed.

Figure 15E:
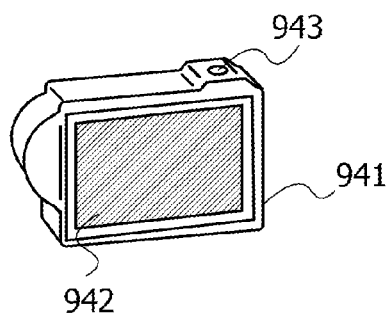

FIG. 15E illustrates a digital camera including a main body 941, a display portion 942, an operation switch 943, and the like. The circuit board including the semiconductor device of the foregoing embodiment is provided in the main body 941. Thus, it is possible to obtain a digital camera with excellent charge retention characteristics and high data read speed.

As described above, the electronic devices shown in this embodiment incorporate the circuit board including the semiconductor device of the foregoing embodiment, thereby having excellent charge retention characteristics and high data read speed.

This application is based on Japanese Patent Application serial No. 2013-148280 filed with Japan Patent Office on Jul. 17, 2013, the entire contents of which are hereby incorporated by reference.

What is claimed is:

1. A semiconductor device comprising a memory element comprising:
    a first transistor; a second transistor; a third transistor; a first capacitor; a second capacitor; a first line; a second line; a third line; a fourth line; and a fifth line,
    wherein:
    one of a source and a drain of the first transistor is electrically connected to the first line;
    the other of the source and the drain of the first transistor is electrically connected to a gate of the second transistor and one electrode of the first capacitor;
    a gate of the first transistor is electrically connected to the second line;
    one of a source and a drain of the second transistor is electrically connected to the third line;
    the other of the source and the drain of the second transistor is electrically connected to one of a source and a drain of the third transistor and one electrode of the second capacitor;
    the other of the source and the drain of the third transistor is electrically connected to the fourth line;
    a gate of the third transistor is electrically connected to the fifth line; and
    a channel formation region of the first transistor includes an oxide semiconductor,
    wherein a thickness of a gate insulating layer of the second transistor is larger than a thickness of a gate insulating layer of the third transistor.

2. The semiconductor device according to claim 1, wherein:
    the one electrode of the first capacitor and the one electrode of the second capacitor are located in a same plane; and the other electrode of the first capacitor and the other electrode of the second capacitor are located in a same plane.

3. The semiconductor device according to claim 1, wherein:
a channel formation region of the second transistor includes silicon; and
the channel formation region of the second transistor and a channel formation region of the third transistor are located in different planes.

4. The semiconductor device according to claim 1, wherein a channel formation region of the second transistor includes an oxide semiconductor.

5. The semiconductor device according to claim 1, wherein the channel formation region of the first transistor and a channel formation region of the second transistor are located in a same plane.

6. The semiconductor device according to claim 1, wherein:
the other electrode of the first capacitor is electrically connected to a ground line; and
the other electrode of the second capacitor is electrically connected to the ground line.

7. The semiconductor device according to claim 1, wherein:
the first line is a data line;
the second line is a write selection line;
the third line is configured to be supplied with a constant potential;
the fourth line is a read data line; and
the fifth line is a read selection line.

8. The semiconductor device according to claim 1, wherein a channel formation region of the second transistor includes silicon.

9. The semiconductor device according to claim 1, wherein a channel formation region of the third transistor includes silicon.

10. A semiconductor device comprising:
a first transistor; a second transistor; a third transistor; a first capacitor; a second capacitor; a first line; a second line; a third line; a fourth line; and a fifth line,
wherein:
one of a source and a drain of the first transistor is electrically connected to the first line;
the other of the source and the drain of the first transistor is electrically connected to a gate of the second transistor and one electrode of the first capacitor;
a gate of the first transistor is electrically connected to the second line;
one of a source and a drain of the second transistor is electrically connected to the third line;
the other of the source and the drain of the second transistor is electrically connected to one of a source and a drain of the third transistor and one electrode of the second capacitor;
the other of the source and the drain of the third transistor is electrically connected to the fourth line;
a gate of the third transistor is electrically connected to the fifth line;
a channel formation region of the first transistor includes an oxide semiconductor;
the other electrode of the first capacitor is electrically connected to a ground line;
the other electrode of the second capacitor is electrically connected to the ground line;
the first line is a data line;
the second line is a write selection line;
the third line is configured to be supplied with a constant potential;
the fourth line is a read data line;
the fifth line is a read selection line;
a channel formation region of the third transistor includes single crystal silicon; and
a thickness of a gate insulating layer of the second transistor is larger than a thickness of a gate insulating layer of the third transistor.

11. The semiconductor device according to claim 10, wherein:
the one electrode of the first capacitor and the one electrode of the second capacitor are located in a same plane; and
the other electrode of the first capacitor and the other electrode of the second capacitor are located in a same plane.

12. The semiconductor device according to claim 10, wherein:
a channel formation region of the second transistor includes silicon; and
the channel formation region of the second transistor and the channel formation region of the third transistor are located in different planes.

13. The semiconductor device according to claim 10, wherein a channel formation region of the second transistor includes an oxide semiconductor.

14. The semiconductor device according to claim 10, wherein the channel formation region of the first transistor and a channel formation region of the second transistor are located in a same plane.

15. The semiconductor device according to claim 10, wherein a channel formation region of the second transistor includes silicon.

16. A method for driving a semiconductor device comprising:
a first transistor; a second transistor; a third transistor; a first node; a second node; a first line; and a read data line, wherein the first node is electrically connected to one of a source and a drain of the first transistor and a gate of the second transistor, the second node is electrically connected to one of a source and a drain of the second transistor and one of a source and a drain of the third transistor, the first line is electrically connected to the other of the source and the drain of the second transistor, the read data line is electrically connected to the other of the source and the drain of the third transistor, and a potential is supplied to the first line, the method comprising the steps of:
turning on the first transistor so as to write data in the first node;
turning off the first transistor so as to store the data in the first node;
holding a reading potential in the second node, wherein a level of the reading potential is controlled by the data that controls a conduction state of the second transistor;
turning on the third transistor so as to electrically connect the second node and the read data line that is in an electrically floating state, thereby reading a first potential of the read data line, the first potential being changed by the reading potential; and
turning off the third transistor so as to restore the reading potential in the second node in accordance with the data in the first node.

17. The method for driving a semiconductor device, according to claim 16, wherein the reading potential is supplied to the second node via the second transistor and the third transistor.

18. The method for driving a semiconductor device, according to claim 16, wherein the read data line being in the electrically floating state has a second potential that is lower than the reading potential.

* * * * *